US009415456B2

(12) United States Patent
Maeda

(10) Patent No.: US 9,415,456 B2
(45) Date of Patent: Aug. 16, 2016

(54) ANTIOXIDANT GAS BLOW-OFF UNIT

(71) Applicant: Shinkawa Ltd., Tokyo (JP)

(72) Inventor: Toru Maeda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/679,135

(22) Filed: Apr. 6, 2015

(65) Prior Publication Data

US 2015/0209886 A1 Jul. 30, 2015

Related U.S. Application Data

(63) Continuation of application No. PCT/JP2013/060892, filed on Apr. 11, 2013.

(30) Foreign Application Priority Data

Oct. 5, 2012 (JP) ................. 2012-222972

(51) Int. Cl.
| | | |
|---|---|---|
| B23K 31/02 | (2006.01) |
| B23K 3/08 | (2006.01) |
| H01L 23/00 | (2006.01) |
| B23K 20/00 | (2006.01) |
| B23K 20/26 | (2006.01) |

(52) U.S. Cl.
CPC ............... *B23K 3/082* (2013.01); *B23K 20/007* (2013.01); *B23K 20/26* (2013.01); *H01L 24/78* (2013.01); *H01L 24/85* (2013.01); *H01L 24/45* (2013.01); *H01L 2224/45139* (2013.01); *H01L 2224/45144* (2013.01); *H01L 2224/45147* (2013.01); *H01L 2224/781* (2013.01); *H01L 2224/78253* (2013.01); *H01L 2224/78269* (2013.01); *H01L 2224/78301* (2013.01); *H01L 2224/85045* (2013.01); *H01L 2224/85054* (2013.01); *H01L 2224/85205* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 4,549,059 A | * | 10/1985 | Kamijo ................ | B23K 20/007 219/56.21 |
| 4,976,393 A | | 12/1990 | Nakajima et al. | |
| 4,998,002 A | * | 3/1991 | Okikawa .............. | B23K 20/007 219/56.22 |

(Continued)

FOREIGN PATENT DOCUMENTS

| | | | |
|---|---|---|---|
| JP | 63055946 A | * | 3/1988 |
| JP | 63-164230 | | 7/1988 |

(Continued)

OTHER PUBLICATIONS

Machine translation of JP-2009-141211A (no date available).*

(Continued)

*Primary Examiner* — Kiley Stoner
(74) *Attorney, Agent, or Firm* — Katten Muchin Rosenman LLP

(57) ABSTRACT

An antioxidant gas blow-off unit comprises a plate-shaped hollow base portion with an antioxidant gas flow passage formed therein, a hole provided in the base portion so as to allow a capillary to be inserted thereinto or removed therefrom and configured to communicate with the antioxidant gas flow passage, and a plurality of electrodes embedded in a wall of the base portion in the vicinity of the hole and configured to generate plasma from an antioxidant gas. With the antioxidant gas blow-off unit, the bonding quality of a wire bonding apparatus can be improved.

9 Claims, 16 Drawing Sheets

(56) References Cited

U.S. PATENT DOCUMENTS

| | | | |
|---|---|---|---|
| 6,234,376 B1 * | 5/2001 | Wicen | H01L 24/85 219/56.22 |
| 7,938,308 B1 * | 5/2011 | Kim | B23K 20/007 219/56.1 |
| 2003/0098330 A1 * | 5/2003 | Morita | B23K 20/007 228/4.5 |
| 2004/0000577 A1 * | 1/2004 | Nishiura | B23K 20/005 228/180.5 |
| 2009/0039141 A1 | 2/2009 | Clauberg et al. | |
| 2010/0230476 A1 | 9/2010 | Gillotti et al. | |
| 2011/0049219 A1 * | 3/2011 | Huang | B23K 20/007 228/42 |
| 2014/0332583 A1 * | 11/2014 | Maeda | H01L 24/85 228/4.5 |

FOREIGN PATENT DOCUMENTS

| | | | | |
|---|---|---|---|---|
| JP | 63-266845 | | 11/1988 | |
| JP | 03-253045 | | 11/1991 | |
| JP | 03-253045 | A | 11/1991 | |
| JP | 4-7102 | B | 2/1992 | |
| JP | 2975207 | B2 * | 11/1999 | H01L 24/78 |
| JP | 2002-151543 | A | 5/2002 | |
| JP | 2002-270623 | A | 9/2002 | |
| JP | 2007-294975 | | 11/2007 | |
| JP | 2008-535251 | | 8/2008 | |
| JP | 2011-040635 | | 2/2011 | |
| JP | 2011-040635 | A | 2/2011 | |
| JP | 4852521 | B | 10/2011 | |

OTHER PUBLICATIONS

International Search Report dated Jul. 16, 2013, from corresponding International Application No. PCT/JP2013/060892.

Japanese Office Action dated Nov. 10, 2015 from Related Japanese Patent Application No. 2014-539623.

* cited by examiner

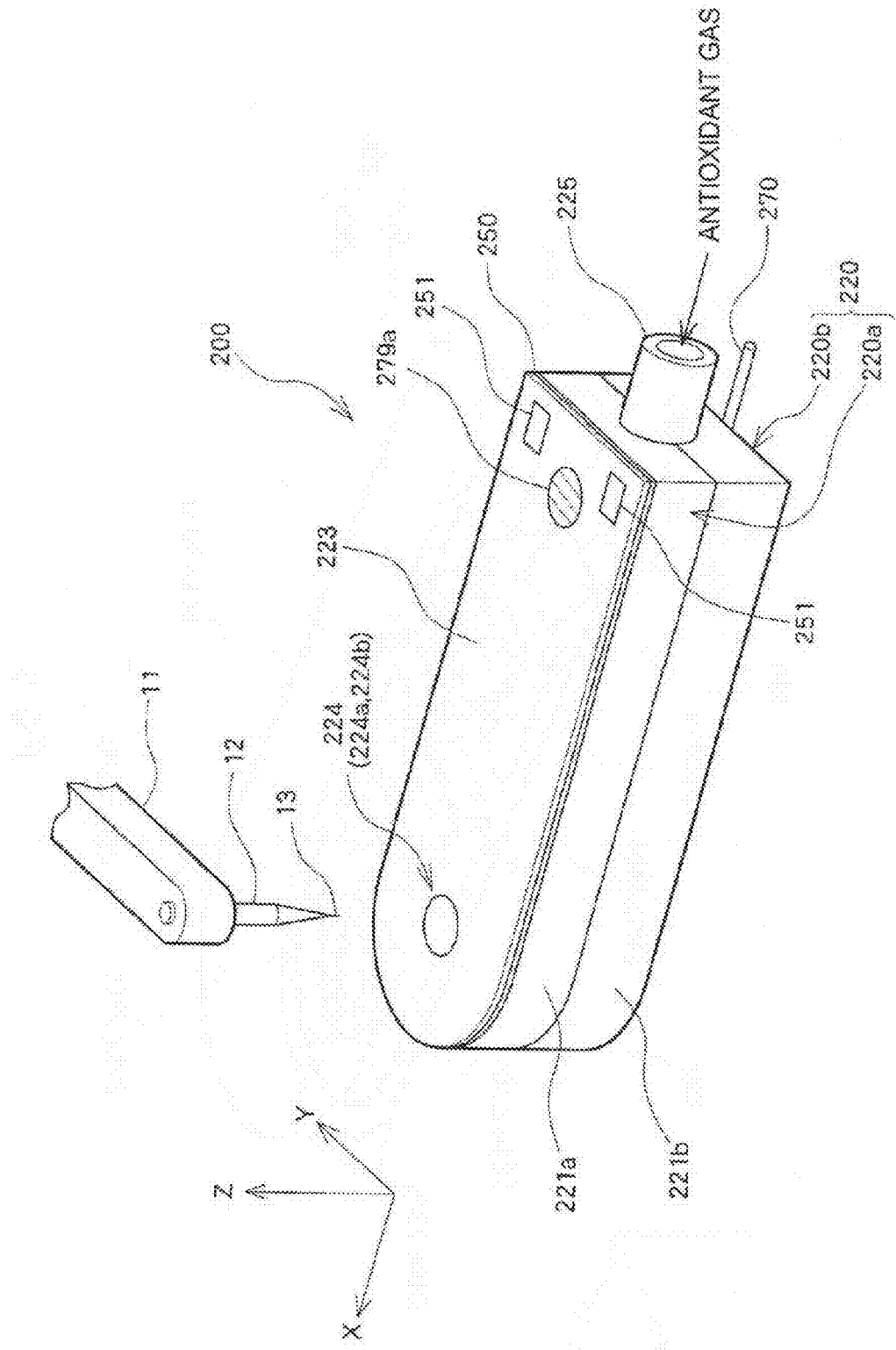

ANTIOXIDANT GAS BLOW-OFF UNIT

BACKGROUND OF THE INVENTION

1. Field of the Invention

The present invention relates to the structure of an antioxidant gas blow-off unit to be installed in a wire bonding apparatus.

2. Description of the Related Art

A large number of wire bonding apparatus employ ball bonding. In the ball bonding, a wire tail that extends from the tip of a capillary as a bonding tool is formed into a free air ball by a spark, and then the free air ball is bonded to a semiconductor element or an electrode of a substrate with the tip of the capillary.

Although gold wires have been conventionally used for wire bonding, copper wires are now increasingly used because of lower cost and superior electric properties. However, the copper wire is more susceptible to oxidation than the gold wire, and thus when the free air ball is formed from the copper wire by a spark, an oxide film might be formed on the surface of the ball. Such an oxide film weakens bonding between the free air ball and the electrode, leading to defective bonding. For this reason, a method for suppressing the oxidation of the surface of the ball is proposed which includes forming a free air ball under inert gas, such as nitrogen or argon gas, in bonding by use of a copper wire (see for example, Patent Document 1).

In contrast, when the surface temperature of the free air ball becomes low at the time of bonding, the bonding strength between the free air ball and electrode might be weakened. Furthermore, when the surface temperature of the free air ball becomes low at the time of forming the free air ball, the resultant ball might be deformed (formed into a noncircular shape). For this reason, a method for ensuring the bonding strength is proposed which includes flowing heated deoxidation gas through surroundings of the free air ball before, throughout and after the formation of the free air ball, thereby keeping the temperature of the free air ball at high temperature (see for example, Patent Document 2).

Moreover, another bonding method is proposed which includes suppressing oxidation of the surface of a free air ball by forming the free air ball with the heated inert gas flowing therethrough, while keeping the free air ball at high temperature (see for example, Patent Document 3).

However, like the related art described in Patent Document 2 or Patent Document 3, in the structure for ejecting the heated inert gas from a gas nozzle, it is necessary to increase the flow rate of inert gas in order to maintain an inert gas atmosphere. Therefore, a large-sized heater is also required to heat the inert gas. Potential problems with this case are that the bonding apparatus is enlarged and its slow operation inhibits high-speed bonding.

In the wire bonding apparatus using the copper wires, the surface of the copper wire needs to be cleaned before being bonded to the electrode in order to secure a good bonding state. For that purpose, for example, a method for supplying the copper wire with its clean surface to a bonding tool is proposed which includes removing organic impurities on the surface of the copper wire by applying plasma to the copper wire surface before bonding, and blowing a deoxidation or inert gas toward the wire to suppress the oxidation of the wire surface (see for example, Patent Document 4).

CITATION LIST

Patent Document

Patent Document 1: Japanese Unexamined Patent Application Publication No. 2007-294975
Patent Document 2: Japanese Unexamined Patent Application Publication No. 63(1988)-164230
Patent Document 3: Japanese Unexamined Patent Application Publication No. 63(1988)-266845
Patent Document 4: Japanese Translation of PCT International Application Publication No. 2008-535251

SUMMARY OF THE INVENTION

Problem to be Solved by the Invention

In forming a free air ball at a wire by a spark, it is necessary to apply high discharge voltage of, for example, several kilovolts, to an electric flame off probe. When the discharge voltage applied to the electric flame off probe increases, a sputtering phenomenon is more likely to occur, in which some metals, such as copper, silver or gold, forming the wire adhere to the surface of the metal electric flame off probe as fine particles upon spark. The sputtering phenomenon can cause contamination of the electric flame off probe, inhibiting formation of good free air balls.

Even when the copper wire is used under the inert gas atmosphere to form the free air ball in bonding, an oxide film is sometimes formed slightly and partially on the wire surface even though most of the oxide film on the wire surface can be suppressed. The oxide film can weaken adhesion between the free air ball and electrode, lowering the bonding quality.

Accordingly, it is an object of the present invention to improve the bonding quality of a wire bonding apparatus.

Means for Solving Problem

An antioxidant gas blow-off unit according to the present invention includes a base portion configured as a hollow plate having an antioxidant gas flow passage formed therein, a hole provided in the base portion to allow a capillary to be inserted thereinto or removed therefrom, the hole communicating with the antioxidant gas flow passage, and a plurality of electrodes embedded in a wall of the base portion in the vicinity of the hole, the electrodes being configured to generate plasma from an antioxidant gas.

In the antioxidant gas blow-off unit according to the present invention, preferably, the plurality of electrodes includes at least one pair of electrodes positioned opposite to each other, and the pair of electrodes is embedded in the wall of the base portion which forms the antioxidant gas flow passage.

In the antioxidant gas blow-off unit according to the present invention, preferably, the antioxidant gas flow passage is provided with at least one outlet through which the antioxidant gas is blown out toward a center of the hole, and the pair of electrodes is embedded in the wall of the base portion within a peripheral region of the outlet.

The antioxidant gas blow-off unit according to the present invention further preferably includes a heater mounted on an outer surface of the base portion, the heater being configured to heat the antioxidant gas. The antioxidant gas flow passage preferably includes a first flow passage provided in the vicinity of the outer surface of the base portion on which the heater is mounted, and a second flow passage provided between the first flow passage and the hole, the second flow passage being deeper than the first flow passage. The pair of electrodes are preferably embedded in the wall of the base portion forming the second flow passage.

In the antioxidant gas blow-off unit according to the present invention, the antioxidant gas flow passage preferably includes a labyrinth that changes a flow direction of the antioxidant gas at least twice. The antioxidant gas blow-off unit further preferably includes an electric flame off probe disposed in a through-hole which is formed in a side surface of the hole.

Effects of the Invention

Therefore, the present invention provides an advantageous effect of improving the bonding quality of a wire bonding apparatus.

BRIEF DESCRIPTION OF THE DRAWINGS

FIG. 7 shows a perspective view of a wire bonding apparatus in which an antioxidant gas blow-off unit according to another embodiment of the present invention is installed;

DESCRIPTION OF THE PREFERRED EMBODIMENTS

Figure 1:
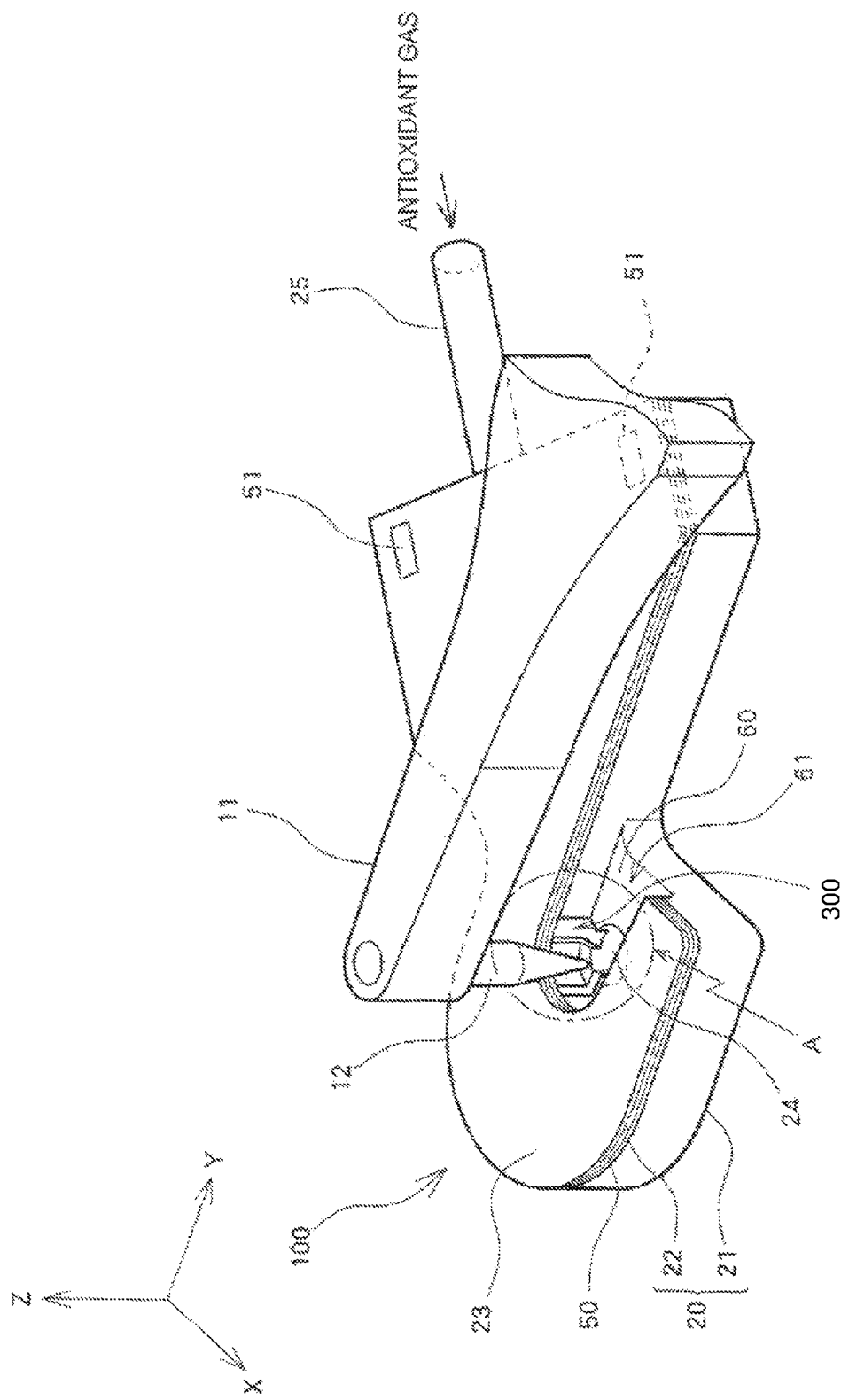
FIG. 1 shows a perspective view of a wire bonding apparatus in which an antioxidant gas blow-off unit according to an embodiment of the present invention is installed.

Exemplary embodiments of the present invention will be described below with reference to the accompanying drawings. As shown in FIG. 1, an antioxidant gas blow-off unit 100 according to an embodiment includes a plate-shaped hollow base portion 20 having an antioxidant gas flow passage 300 formed therein, a hole 24 provided in the base portion 20 so as to allow a capillary 12 to be inserted thereinto or removed therefrom and communicating with the antioxidant gas flow passage 300, and a heater 50 mounted on an outer surface of the base portion 20.

As shown in FIG. 1, the base portion 20 includes a main body 21 having on its surface a groove (to be described later) forming the antioxidant gas flow passage 300, and a thin flat-plate-shaped lid 22 mounted on the main body 21 and configured to close an opened end of the groove formed in the main body 21 to form the antioxidant gas flow passage 300 together with the groove. Thus, the (upper) surface of the lid 22 opposite to the main body 21 forms the outer surface of the base portion 20. The film-shaped heater 50 that has substantially the same planar shape as the lid 22 is mounted on the upper surface of the lid 22, or the outer surface of the base portion 20. A cover plate 23 that has substantially the same planar shape as the lid 22 is mounted on the upper surface of the heater 50. Electrodes 51 of the heater 50 are exposed from the cover plate 23. An antioxidant gas supply pipe 25 to which an antioxidant gas is supplied is connected to the main body 21.

Figure 2:
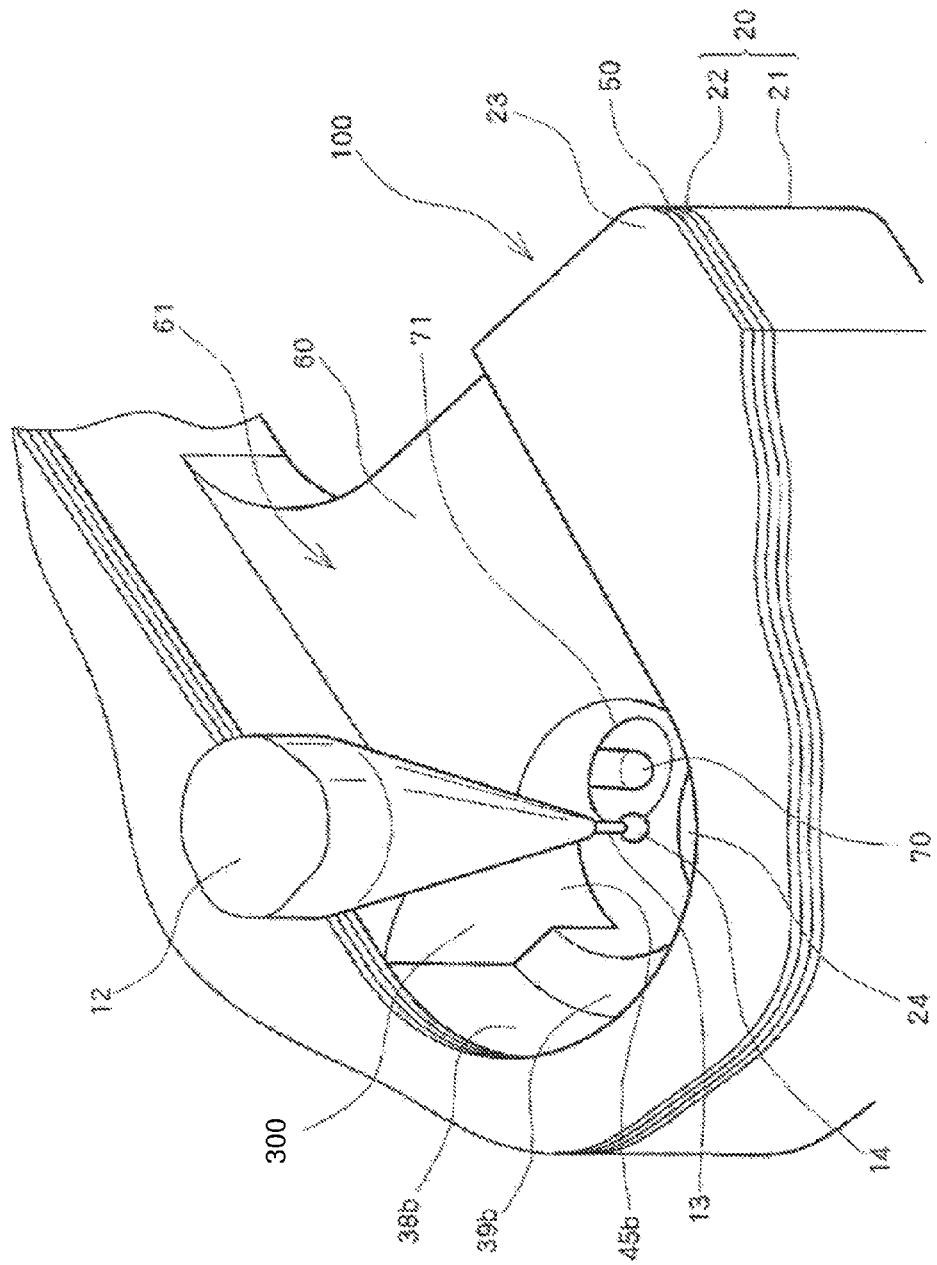
FIG. 2 shows an enlarged perspective view of a part A in FIG. 1.

As shown in FIG. 2, a through-hole 71 is provided at the side surface of the hole 24 communicating with the antioxidant gas flow passage 300. An electric flame off probe 70 is disposed in the through-hole 71. The electric flame off probe 70 discharges electricity with a wire tail 13 extending from the tip of the capillary 12 to form the tip of the wire tail 13 into a free air ball 14.

When performing a bonding operation, the capillary 12 shown in FIG. 1 is moved vertically (along the direction Z) with an ultrasonic horn 11 attached to a bonding arm (not shown), and presses the free air ball 14 formed at the tip of the wire tail 13 against an electrode of a semiconductor die or substrate, thereby bonding the wire to the electrode. The antioxidant gas blow-off unit 100 is installed in a bonding head (not shown) provided with the ultrasonic horn 11, and is configured to move in directions X and Y together with both the ultrasonic horn 11 and the capillary 12. Examples of the antioxidant gas include an inert gas, such as a nitrogen or argon gas, and a mixture gas thereof containing a deoxidation gas, such as a hydrogen gas.

Figure 3:
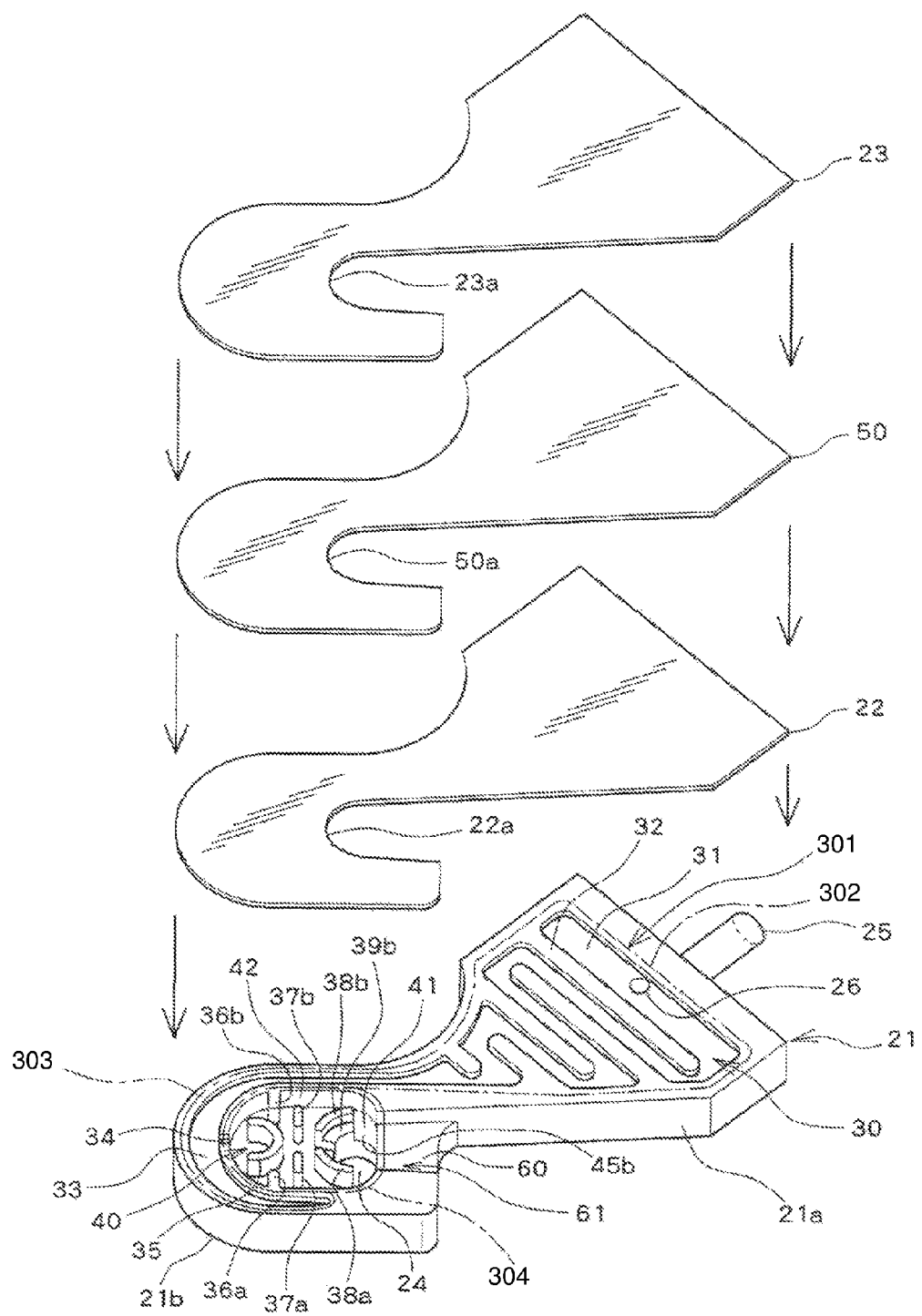
FIG. 3 shows a perspective view of a configuration of the antioxidant gas blow-off unit in the embodiment of the present invention.
Figure 5:
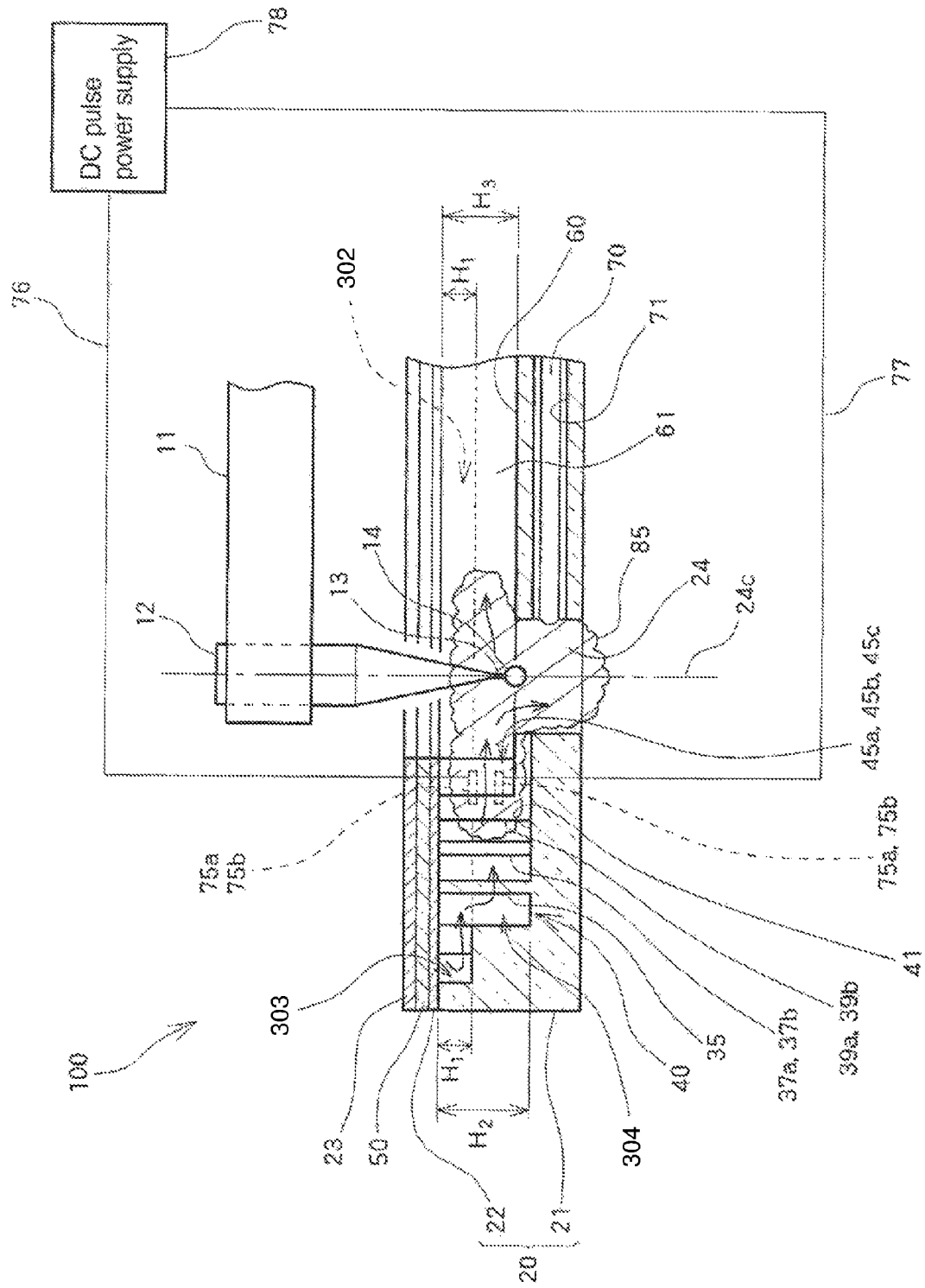
FIG. 5 shows a schematically explanatory view of a cross section of the antioxidant gas blow-off unit in the embodiment of the present invention.

As shown in FIG. 3, the main body 21 includes a substantially trapezoidal first part 21a having its width decreased from a base part thereof with the antioxidant gas supply pipe 25 attached thereto toward the tip thereof, and a rectangular second part 21b having its rounded tip and provided with the hole 24 through which the capillary 12 passes. The surface of the first part 21a is provided with a shallow meandering groove 31, and band-shaped ridges 32 between the meandering parts of the groove 31. The groove 31 in the base part side of the first part 21a is provided with an antioxidant gas supply hole 26 that communicates with the antioxidant gas supply pipe 25. The circumferential surface of the second part 21b is provided with a groove 33 that includes a linear part connected to the groove 31, and a crescent part formed along a semicircular shape at the tip of the second part 21b. As shown in FIG. 5, an upstream flow passage 302 and a downstream flow passage 303 (grooves 31 and 33 in FIG. 3) in this embodiment have the same depth $H_1$.

A recess 40 is formed in the center of the second part 21b that is deeper than the grooves 31 and 33. The groove 33 and the recess 40 communicate with each other through a connection flow passage 34. As shown in FIG. 5, the recess 40 has a depth $H_2$. Projections 35, 36a, 36b, 37a, 37b, 38a and 38b are provided within the recess 40. Specifically, as shown in FIGS. 3 and 4B, the projection 35 is a semi-cylindrical projection that projects from a bottom surface 41 of the recess 40. The projection 35 is incurved toward the connection flow passage 34. The projections 36a and 36b are plate-shaped projections that project from left and right side surfaces 42 of the recess 40, respectively, toward the side surfaces of the projection 35. The projections 37a and 37b are plate-shaped projections that project from the bottom surface 41 of the recess 40 on the hole 24 side of each gap between the projection 35 and each of the projections 36a and 36b. The projections 38a and 38b are arc-shaped projections that project from the bottom surface 41 of the recess 40 and which are disposed spaced apart from each other along the periphery of the hole 24. As shown in FIG. 3, the projections 38a and 38b are provided with stages 39a and 39b, respectively, on their side surfaces facing the hole 24. The stages 39a and 39b are positioned at a higher level than the bottom surface 41 of the recess 40.

A groove 60 is provided in the main body 21 at a location close to the hole 24 in the recess 40 that is shallower than the recess 40. The groove 60 has a depth $H_3$ from the surface of the main body 21 as shown in FIG. 5. Each of the stages 39a and 39b also has the depth $H_3$ from the surface of the main body 21 as shown in FIG. 5.

As shown in FIG. 5, all the upper surfaces of the ridges 32 and the projections 35, 36a, 36b, 37a, 37b, 38a and 38b are flush with the surface of the main body 21 with the lid 22 mounted thereon. As shown in FIG. 3, the lid 22 has a shape equivalent to that formed by removing parts corresponding to both the groove 60 and the area surrounding the hole 24 from the outline of the main body 21 so as to have a U-shape notch. Further, a U-shaped notch 22a of the lid 22 is slightly smaller in radius than the arc-shaped surface of each of the projections 38a and 38b on the hole 24 side. Therefore, as shown in FIG. 3, when the flat sheet lid 22 is mounted on the main body 21, the surface of the main body 21 surrounding the grooves 31 and 33 and the respective upper surfaces of the ridges 32 and projections 35, 36a, 36b, 37a, 37b, 38a and 38b make contact with the bottom surface of the lid 22. As a result, the lid 22, the grooves 31 and 33, and the ridges 32 configure a shallow first flow passage 301. The first flow passage 301 includes a meandering upstream flow passage 302 formed close to the surface of the first part 21a in the main body 21, and a crescent downstream flow passage 303 that continues to a linear passage formed close to the surface of the second part 21b in the main body 21. The lid 22, the recess 40, and the projections 35, 36a, 36b, 37a, 37b, 38a and 38b configure a second flow passage 304 that communicates with the hole 24. The first flow passage 301 and the second flow passage 304 communicate with each other through the connection flow passage 34. Accordingly, the antioxidant gas flow passage 300 is formed of the first flow passage 301 including the upstream flow passage 302 and the downstream flow passage 303, and the second flow passage 304 disposed between the first flow passage and the hole 24.

As shown in FIG. 3, the linear part of the downstream flow passage 303 in the first flow passage 301 is disposed parallel to the second flow passage 304, and the crescent part of the downstream flow passage 303 is disposed along the outer periphery of the second flow passage 304 and between the second flow passage 304 and the outer surface of the second part 21b. Accordingly, the downstream flow passage 303 surrounds the second flow passage 304 at the tip end of the second part 21b.

Both the groove 60 and the area surrounding the hole 24 which correspond to the U-shaped notch 22a of the lid 22 are not covered with the lid 22 to be left open. Thus, the hole 24 is visible from the surface of the lid 22. Furthermore, the groove 60 forms a groove-shaped flow passage 61 that is opened toward the lid 22, and creates a clearance for preventing the ultrasonic horn 11 from hitting the main body 21 when the ultrasonic horn 11 moves downward.

As shown in FIG. 3, the film-shaped heater 50 and the cover plate 23 also have substantially the same shape as the lid 22, and are provided with U-shaped notches 50a and 23a, respectively, that have substantially the same shape as the notch 22a of the lid 22. Accordingly, when the lid 22, the heater 50, and the cover plate 23 are stacked on the surface of the main body 21, the U-shaped notches 50a and 23a of the heater 50 and the cover plate 23, respectively, do not also cover the area surrounding the hole 24 and the groove 60. As a result, the capillary 12 can enter the hole 24 through the U-shaped notches 22a, 50a and 23a, as shown in FIG. 1. In this embodiment, each of the main body 21, the lid 22, and the cover plate 23 can be made of ceramic. As shown in FIG. 3, the main body 21, the lid 22, the heater 50, and the cover plate 23 can be stacked in that order, and are formed by sintering or assembled with glue.

Figure 4A:
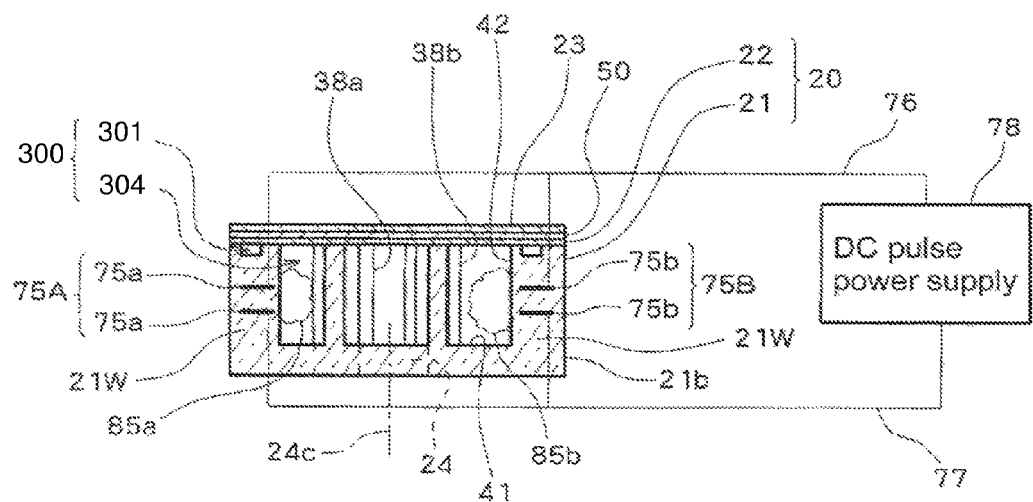
FIG. 4A shows a cross-sectional view of an arrangement of the antioxidant gas path and electrodes in the antioxidant gas blow-off unit in the embodiment of the present invention.
Figure 4B:
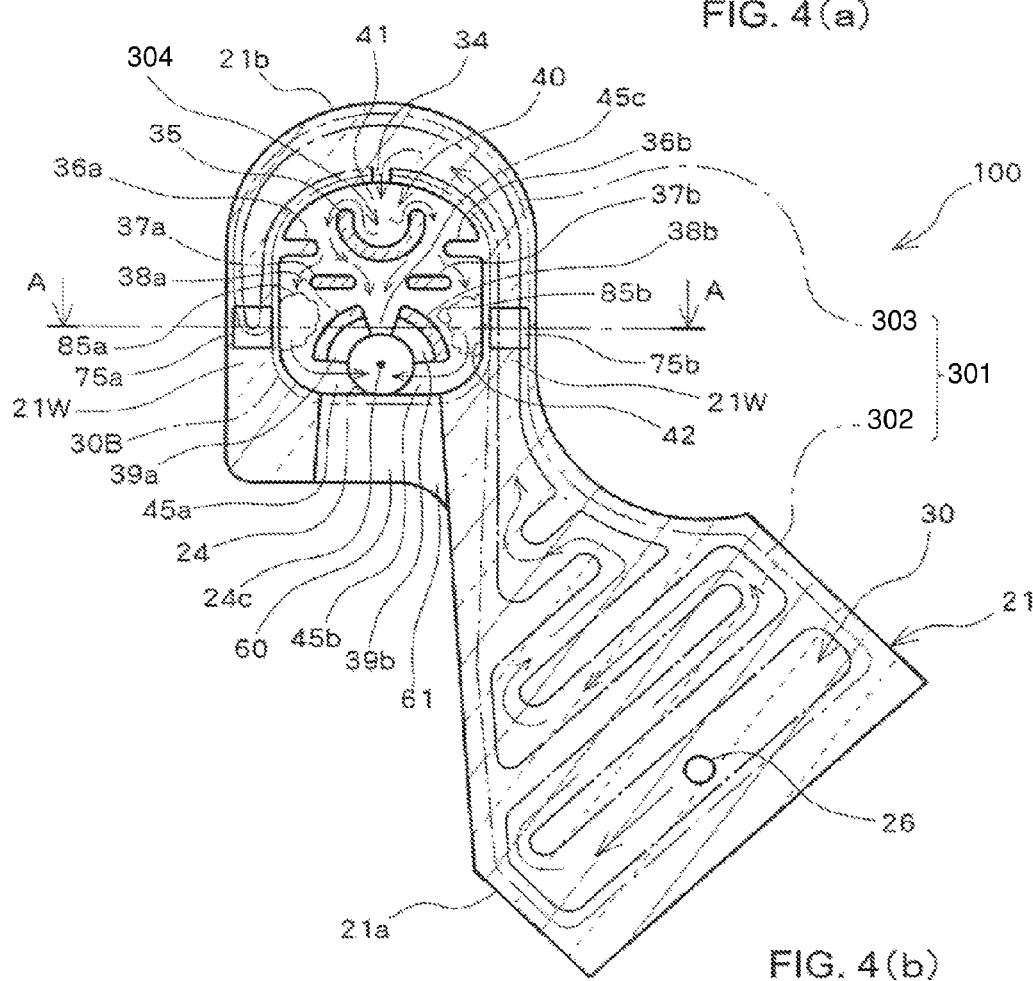
FIG. 4B shows a plan view of the arrangement of the antioxidant gas path and electrodes in the antioxidant gas blow-off unit in the embodiment of the present invention.

As shown in FIGS. 3, 4A and 4B, the meandering upstream flow passage 302 configured with the lid 22, the groove 31 and the ridges 32 has a sectional passage area that decreased toward its downstream. The most downstream, linear part of the upstream flow passage 302 which extends from the first part 21a to the second part 21b has the smallest sectional passage area. The linear part of the upstream flow passage 302 is connected to the linear part of the downstream flow passage 303 provided in the second part 21b of the main body 21. The downstream flow passage 303 is formed with the lid 22, the groove 33, and the surface of the main body 21 around the groove 33, and includes the linear and crescent parts. The linear part has the smallest sectional passage area in the downstream flow passage 303. The crescent part of the downstream flow passage 303 has a sectional passage area that gradually increases toward the tip end of the second part 21b but gradually decreases away from the tip end of the second part 21b, and extends to the site of the second part 21b opposite to the first part 21a. The crescent part of the downstream flow passage 303 is smaller in sectional passage area than the meandering parts of the upstream flow passage 302.

As shown in FIG. 4B, electrodes 75b that are used to generate plasma from the antioxidant gas passing through the second flow passage 304 are embedded in a wall 21w of the second part 21b located below the linear part of the downstream flow passage 303. In addition, electrodes 75a are also embedded in the wall 21w of the second part 21b located opposite to the electrodes 75b across the hole 24.

As shown in FIG. 4A, the opposing pairs of electrodes 75a and 75a and electrodes 75b and 75b are embedded in the wall 21w formed of the side surface 42 of the recess 40 that configures the second flow passage 304. The upper ones of the electrodes 75a and 75b are connected to a DC pulse power supply 78 with a connection wire 76, whereas the lower ones thereof are connected to the DC pulse power supply 78 with a connection wire 77. The two electrodes 75a arranged vertically opposite each other in the wall 21w on the left side in FIG. 4A makes a single electrode pair 75A. Likewise, the two electrodes 75b arranged vertically opposite to each other in the wall 21w on the right side in FIG. 4A makes a single electrode pair 75B. In short, the antioxidant gas blow-off unit 100 in this embodiment is provided with the two electrode pairs.

As shown in FIG. 4A, when a high pulse voltage is applied to between the electrodes 75a and 75a in the electrode pair 75A and between the electrodes 75b and 75b in the electrode pair 75B, the antioxidant gas is subjected to a plasma treatment on the surface of the wall 21w with the electrode pairs 75A and 75B embedded therein on the second flow passage 304 side near the electrode pairs 75A and 75B, that is, in regions between the side surface 42 of the recess 40 and each of the projections 38a and 38b as indicated with cloud marks, thereby producing antioxidant gas plasmas 85a and 85b.

As shown in FIG. 5, both the upstream flow passage 302 and the downstream flow passage 303 are formed shallowly in the vicinity of the surface of the main body 21, and the lid 22 is formed of a thin flat plate. In addition, as shown in FIG. 3, the heater 50 is mounted over the entire region of the lid 22 covering the upstream flow passage 302 and the downstream flow passage 303. The antioxidant gas can be effectively heated with the heater 50. As described above, since the linear part that connects the upstream flow passage 302 to the downstream flow passage 303 has the smallest sectional passage area, the antioxidant gas travels through the linear part at the fastest flow rate. Moreover, since the crescent part of the downstream flow passage 303 is slightly smaller in sectional passage area than the meandering parts of the upstream flow passage 302, the antioxidant gas travels through the crescent part at a slightly slower flow rate than the above linear part. The crescent part of the downstream flow passage 303 disposed in a region (on the downstream side) beyond the tip of the second part 21b has a closed end, so that the antioxidant gas stays within the crescent part.

As shown in FIGS. 3 and 4B, the antioxidant gas flows into the upstream flow passage 302 through the antioxidant gas supply hole 26 provided in the groove 31 in the first part 21a of the main body 21. Then, the antioxidant gas travels through the meandering parts of the shallow upstream flow passage 302 while changing its flow direction, as indicated with arrows in FIG. 4B. In a region from the upstream flow passage 302 to the crescent part of the downstream flow passage 303, the groove 31 is formed shallowly, so that the antioxidant gas effectively absorbs heat from the heater. While the antioxidant gas is traveling in the long meandering parts, the temperature of the antioxidant gas is gradually increasing. Then, when the antioxidant gas flows into the linear part that connects the upstream flow passage 302 to the downstream flow passage 303, the temperature of the antioxidant gas further increases. Subsequently, when the antioxidant gas flows into the crescent part of the downstream flow passage 303 positioned ahead (upstream) of the tip of the second part 21b, the temperature of the antioxidant gas further gradually increases. To give an example of increasing the temperature of the antioxidant gas in this embodiment, assuming that the film-shaped heater 50 is 0.015 mm thick and the input electricity is 1 W, it is possible to increase the temperature of the antioxidant gas traveling at a flow rate of 0.3 liter/min from a normal temperature to about 130.degree. C. At this time, the temperature of the heater 50 is about 150.degree. C. The crescent part of the downstream flow passage 303 disposed in a region (on the downstream side) beyond the tip of the second part 21b has the closed end, so that the antioxidant gas with increased temperature stays within the crescent part.

The high-temperature antioxidant gas flows into the second flow passage 304 through the connection flow passage 34. As described above, the second flow passage 304 is formed with the lid 22, the recess 40 with the depth $H_2$, and the projections 35, 36a, 36b, 37a, 37b, 38a and 38b. The second flow passage 304 is accordingly much larger in sectional passage area than the first flow passage 301 formed with the lid 22 and the shallow grooves 31 and 33 with the depth $H_1$. Thus, the antioxidant gas travels in the second flow passage 304 at a much slower flow rate than the first flow passage 301. For this reason, the antioxidant gas is maintained at high temperature with the heater 50, although being not heated with the heater 50 to the extent that the temperature thereof further increases.

As described above, the linear part of the downstream flow passage 303 in the first flow passage 301 is disposed parallel to the second flow passage 304, and the crescent part of the downstream flow passage 303 is disposed along the outer periphery of the second flow passage 304 between the second flow passage 304 and the outer surface of the second part 21b. Thus, the second flow passage 304 is partly surrounded with the downstream side flow passage 303 where the high-temperature antioxidant gas flows or stays. This suppresses the antioxidant gas in the second flow passage 304 from being reduced in temperature, and maintains the antioxidant gas in the second flow passage 301 at high temperatures in conjunction with heating of the heater 50.

As shown in FIG. 4B, the high-temperature antioxidant gas flowing into the second flow passage 304 has its flow direction changed with the projections 35, 36a, 36b, 37a, 37b, 38a and 38b. More specifically, the antioxidant gas flowing into the second flow passage 304 through the connection flow passage 34 has its flow direction changed with the projection 35 toward the side surface 42 of the recess 40. Then, the flow direction of the gas is sequentially changed with the projections 36a and 36b to the center of the recess 40, and then with the projections 37a and 37b to each of the left and right sides. Subsequently, the flow direction of the gas is changed with the projections 38a and 38b toward the center 24c of the hole 24. Finally, the antioxidant gas flows into outlets 45a, 45b and 45c located between the projections 38a and 38b, and between each of the projections 38a and 38b and the side surface 42 of the recess 40. That is, the projections 35, 36a, 36b, 37a, 37b, 38a and 38b configure a labyrinth that changes the flow direction of the high-temperature antioxidant gas at least twice. Then, the high-temperature antioxidant gas flows uniformly into the outlet 45a, 45b and 45c, which are provided between the projections 38a and 38b, and between each of the projections 38a and 38b and the side surface 42 of the recess 40.

Among these flows, the high-temperature antioxidant gas having flowed into between each of the projections 38a and 38b and the side surface 42 of the recess 40 is subjected to the plasma treatment with the electrode pairs 75A and 75B to which a high pulse voltage is applied by the DC pulse power supply 78 shown in FIG. 4A, thereby producing the high-temperature antioxidant gas plasmas 85a and 85b. The high-temperature antioxidant gas plasmas 85a and 85b are blown out to the center 24c of the hole 24 through the outlets 45a and 45b, respectively. Also, the high-temperature antioxidant gas having flowed into between the projections 38a and 38b is blown out to the center 24c of the hole 24 through the outlet 45c without being subjected to the plasma treatment.

Parts of the high-temperature antioxidant gas plasmas 85a and 85b blown out from the outlets 45a and 45b to the center 24c of the hole 24, and a part of the high-temperature antioxidant gas blown out from the outlet 45c to the center 24c of the hole 24 flow out downward from the lower surface of the main body 21 through the hole 24 as shown in FIG. 5. The remaining parts of the gas flow out horizontally through the groove-shaped flow passage 61 formed with the groove 60.

The second flow passage 304 vertically diffuses the high-temperature antioxidant gas flowing into the first flow passage 301 near the surface of the main body 21, in the height direction of the main body 21, with the antioxidant gas kept at high temperature, so that the high-temperature antioxidant gas can be blown out over a wide range in the height direction. Further, the high-temperature antioxidant gas can be blown as the high-temperature antioxidant gas plasmas 85a and 85b from the outlets 45a and 45b with the electrode pairs disposed ahead of the outlets 45a and 45b. Since the hole 24 is provided in the bottom surface 41 of the recess 40, the flows of the high-temperature antioxidant gas plasmas and antioxidant gas, which are to be blown out from the outlets 45a, 45b and 45c, are not disturbed by external airflow. Moreover, the projections 38a and 38b form walls around the hole 24, and the stages 39a and 39b of the projections 38a and 38b extend so as to be flush with the bottom surface of the groove 60, as shown in FIG. 5. This structure can create an antioxidant gas plasma region 85 filled with a high-temperature and high-concentration antioxidant gas, around the hole 24 as indicated with the cloud marks in FIG. 5. In this embodiment, even at a low flow rate of the antioxidant gas, such as 0.3 liters/min as mentioned above, it is possible to produce the antioxidant gas plasma region 85 that contains the antioxidant gas at a temperature of about 130.degree. C. in a concentration of about 100%.

As shown in FIG. 5, the center of the capillary 12 is aligned with the center 24c of the hole 24. Then, the height of the ultrasonic horn 11 is adjusted such that the wire tail 13 at the tip of the capillary 12 enters the antioxidant gas plasma region 85. Thereafter, electric discharge is generated between the wire tail 13 and the electric flame off probe 70 disposed in the through-hole 71 on the side surface of the hole 24. In this way, the wire tail 13 is formed into the free air ball 14.

At this time, the antioxidant gas plasma region 85 in which the free air ball 14 is formed has been filled with the high-temperature and high-concentration antioxidant gas plasma. Because of ionized particles in the plasma, the discharge voltage required to form the free air ball 14 can be made much lower than that required to generate electric discharge in a non-plasma antioxidant gas. This arrangement can suppress a sputtering phenomenon on the surface of the electric flame off probe 70, thereby stably forming the good free air balls 14 without reduction in discharge properties due to the contaminants on the electric flame off probe 70.

Since the temperature of the antioxidant gas plasma region 85 is kept high, the free air balls 14 can be formed under the high-temperature and high-concentration antioxidant gas. Thus, the free air balls 14 can be suppressed from being deformed (formed into a noncircular shape). In addition, in introducing H.sub.2 gas into the plasma gas, this arrangement can remove the oxide film formed on the surfaces of free air balls 14 due to detergency of antioxidant gas plasma to make the surfaces of the free air balls 14 clean.

The antioxidant gas having a high temperature of about 130.degree. C. can be uniformly blown out to the formed free air balls 14, thereby enabling bonding of the free air balls 14 with the clean surface while keeping the free air balls at high temperature. This can perform the bonding with sufficient bonding strength. Maintaining the free air balls 14 at high temperatures in this manner provides the following merits: bonding can be performed with soft free air balls; and strain hardening of a metal material, such as copper, forming a wire can be suppressed. Specifically, by suppressing a rapid temperature drop of the free air ball, the generation of impurities in the free air ball can be reduced and the hardening of the free air ball can be mitigated. This can decrease a pressing force and heat given to a substrate when performing bonding, achieving damage-free bonding (that hardly causes damage to the substrate and the like). In this way, the bonding qualities are improved. Furthermore, when the temperature of the free air ball increases when performing bonding, metal particles diffuse more appropriately within the bond. This can reduce the application of ultrasonic vibrations, further improving the bonding qualities.

Moreover, the antioxidant gas blow-off unit 100 in this embodiment effectively increases the temperature of the antioxidant gas by using the shallow first flow passage 301 close to the surface of the main body 21 on which the heater 50 is mounted. In turn, the antioxidant gas blow-off unit 100 vertically diffuses the antioxidant gas in the height direction by using the second flow passage 304 that is deeper than the first flow passage 301, and blows out the antioxidant gas uniformly from a region surrounding the hole 24 to the free air ball 14. In this way, the free air ball 14 can be effectively heated or kept at the constant temperature even by a small amount of antioxidant gas, which enables the bonding with the sufficient bonding strength, thereby effectively improving the bonding quality.

Further, the effective heating and heat retention of the free air balls 14 using a small amount of antioxidant gas can result in downsizing of the antioxidant gas flow passage 300 and a compact overall configuration.

Furthermore, the second flow passage 304 is partly surrounded with the downstream side flow passage 303 where the high-temperature antioxidant gas flows or stays. This arrangement can effectively maintain the antioxidant gas in the second flow passage 304 at high temperature, and thus can blow out the high-temperature antioxidant gas plasma and antioxidant gas to the free air balls 14.

Although in the above-mentioned embodiment the antioxidant gas is heated with the heater 50, for example, electrodes can be used instead of or together with the heater 50. In this case, the electrodes are disposed along the upstream flow passage 302 to generate plasma so as to heat the antioxidant gas flowing through the upstream flow passage 302.

Further, in this embodiment, the application of a high pulse voltage by the DC pulse power supply 78 to the electrode pairs 75A and 75B generates plasma from the antioxidant gas. Alternatively, the power source is not limited to the DC pulse power supply 78, and any other power supply can be used as long as the power supply can apply a high pulse voltage to the respective electrode pairs 75A and 75B to produce the plasma from the antioxidant gas. For example, a matching box for matching an incident wave with a reflected wave, or a high-frequency power supply with a matching device can be used to connect a high-frequency electrode of the high-frequency power supply and a ground electrode to the respective electrodes 75a of the electrode pair 75A and the respective electrodes 75b of the electrode pair 75B.

Figure 6A:
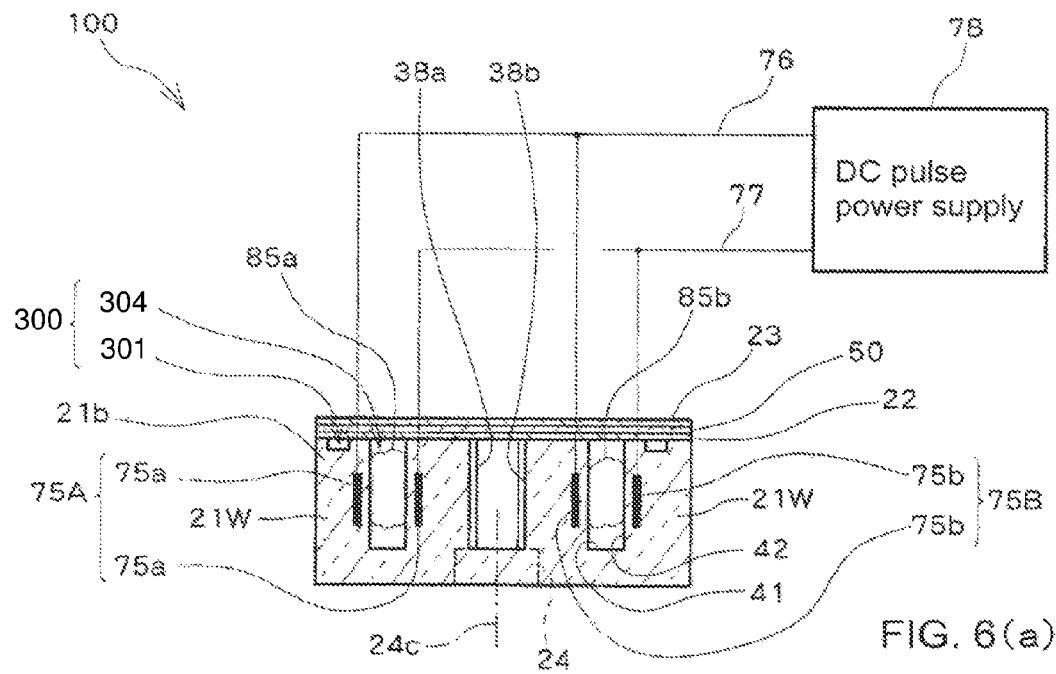
FIG. 6A shows a cross-sectional view of another electrode arrangement in the antioxidant gas blow-off unit in the embodiment of the present invention.
Figure 6B:
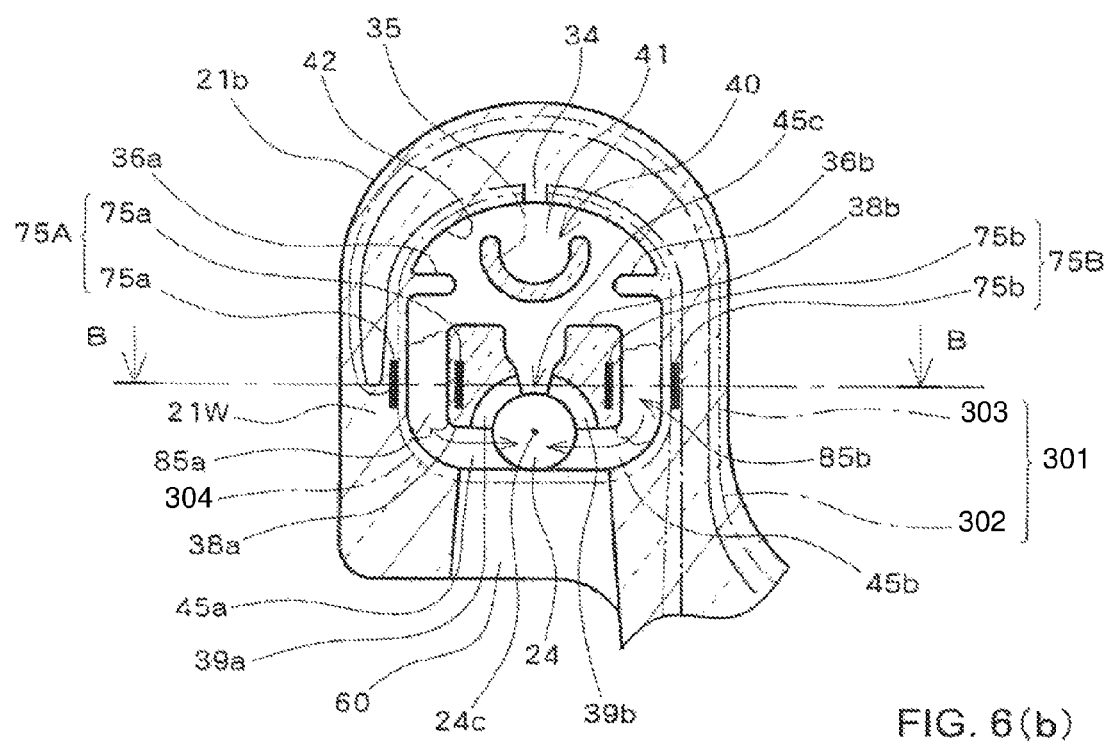
FIG. 6B shows a plan view of another electrode arrangement in the antioxidant gas blow-off unit in the embodiment of the present invention.

Next, a description will be given of another electrode arrangement in the antioxidant gas blow-off unit 100 in the embodiment with reference to FIGS. 6A and 6B. The same parts in the figures as those described with reference to FIGS. 1 to 5 are denoted by the same reference characters and thus a description thereof will be omitted.

As compared to the embodiment described with reference to FIGS. 1 to 5, the antioxidant gas blow-off unit 100 of this embodiment has the following arrangement. Specifically, projections 38a and 38b disposed in the recess 40 each have a larger size. One of electrodes 75a of the electrode pair 75A is embedded in the wall 21w near the side surface 42 of the second part 21b on the left side of the figure. The other electrode 75a of the electrode pair 75A is embedded in the side surface 42 of the projection 38a. One of electrodes 75b of the electrode pair 75B is embedded in the wall 21w near the side surface 42 of the second part 21b on the right side of the figure. The other electrode 75b of the electrode pair 75B is embedded in the side surface 42 of the projection 38b. The projections 38a and 38b project from the bottom surface 41 of the recess 40 provided in the second part 21b in the main body 21, and are integrally molded with the main body 21. Accordingly, both the projections 38a and 38b correspond to the wall of the base portion 20.

In this embodiment, the antioxidant gas flowing into the outlet 45a between the projection 38a and the side surface 42 of the recess 40 is subjected to the plasma treatment with the electrode pair 75A, like the embodiment described with reference to FIGS. 1 to 5. Likewise, the antioxidant gas flowing into the outlet 45b between the projection 38b and the side surface 42 of the recess 40 is subjected to the plasma treatment with the electrode pair 75B.

This embodiment exhibits the same effects as those of the embodiment described with reference to FIGS. 1 to 5.

Next, another embodiment of the present invention will be described with reference to FIGS. 7 to 10. The same parts in FIGS. 7 to 10 as those described with reference to FIGS. 1 to 5 are denoted by the same reference characters, and thus a description thereof will be omitted. In an antioxidant gas blow-off unit 200, as shown in FIG. 7, a casing 220 as the base portion is assembled by joining together an upper-half casing 220a and a lower-half casing 220b both made of ceramic. An upper wall 221a of the upper casing 220a and a lower wall 221b of the lower-half casing 220b are provided with a hole 224a and a hole 224b, respectively, that are coaxial with each other and through which the capillary fixed to the ultrasonic horn 11 passes. Both the holes 224a and 224b form a hole 224. A film-shaped heater 250 that has the same size as the upper-half casing 220a is mounted on the upper surface of the upper-half casing 220a (the outer surface of the casing 220), and a cover plate 223 made of ceramic is mounted on the heater 250. The upper-half casing 220a is provided with two electrodes 251 for energizing the heater 250, and an electrode 279a embedded therein for supplying the DC pulse voltage to the electrode used for applying the plasma treatment to the antioxidant gas. The lower-half casing 220b is also provided with an electrode 279b (not shown) embedded therein for supplying the DC pulse voltage to the electrode used for applying the plasma treatment to the antioxidant gas. An antioxidant gas supply pipe 225 for supplying the antioxidant gas is attached to the base part side of the casing 220. An electric flame off probe 270 by which wire tails 13 extending from the tip of the capillary 12 are formed into free air balls 14 is disposed on the lower surface side of the lower-half casing 220b (on the lower surface side of the casing 220).

Figure 8:
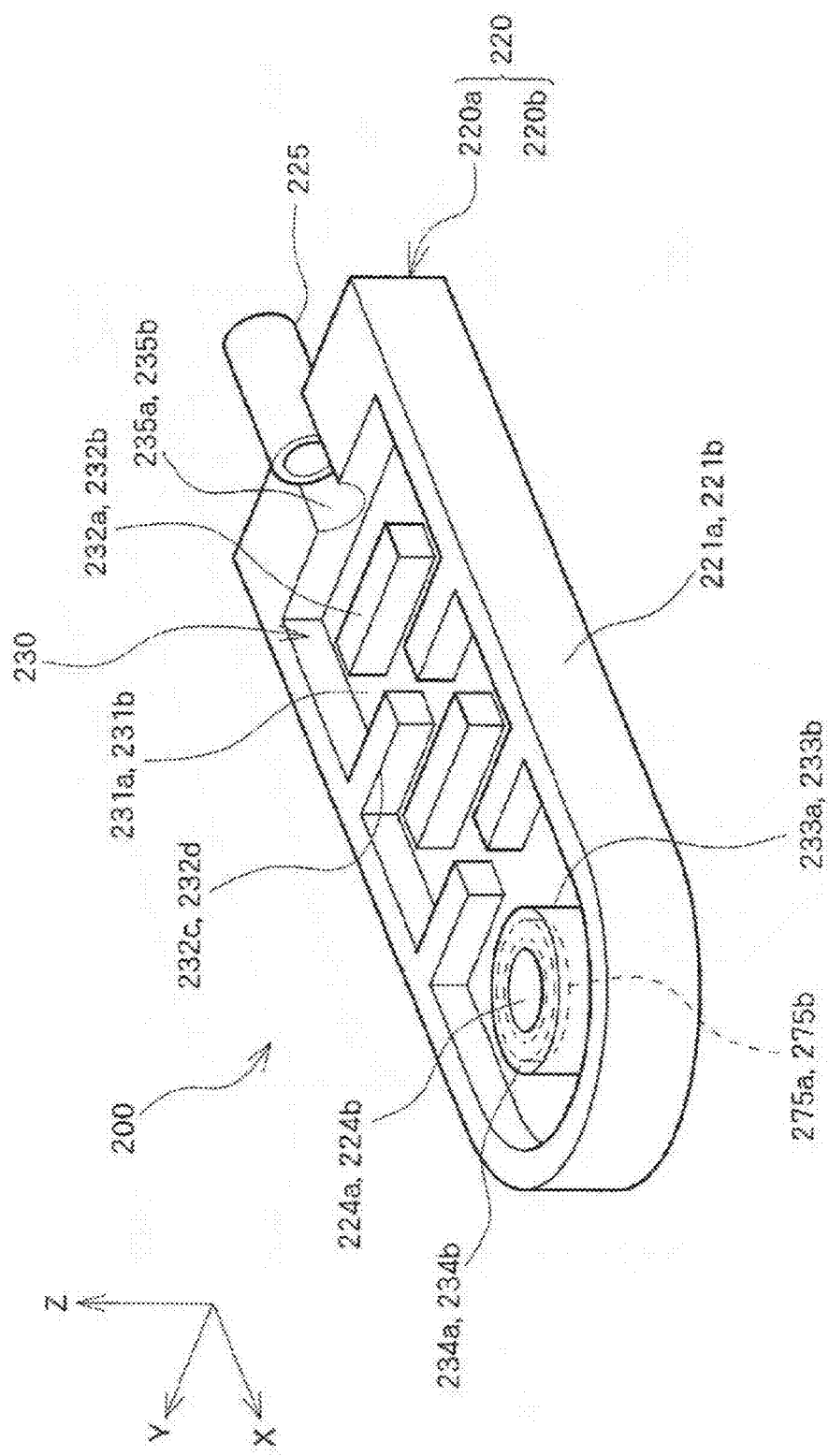
FIG. 8 shows a perspective view of an internal configuration of the antioxidant gas blow-off unit in another embodiment of the present invention.
Figure 9:
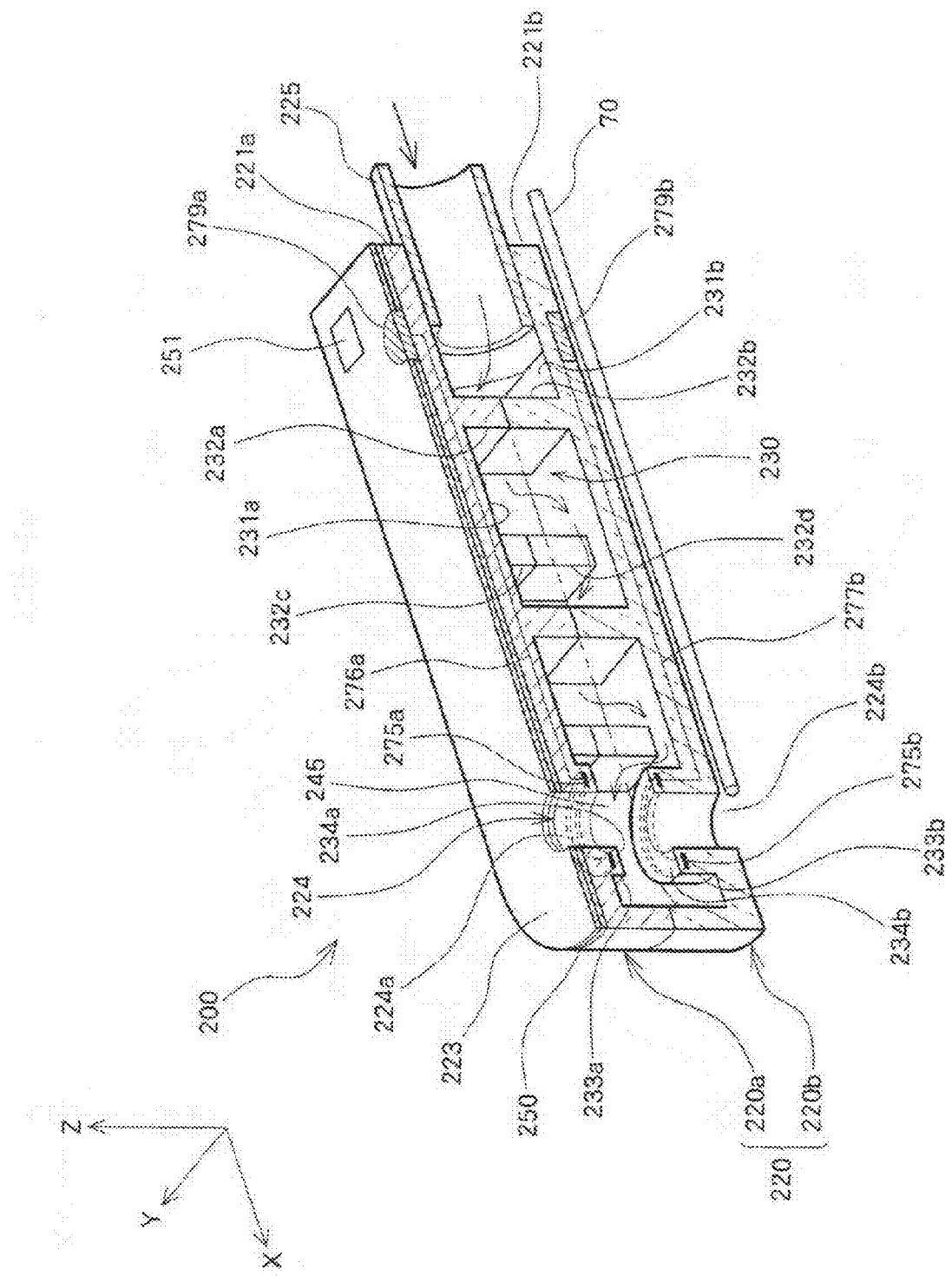
FIG. 9 shows a perspective view of a cross section of the antioxidant gas blow-off unit in another embodiment of the present invention.

As shown in FIG. 8, recesses 231a and 231b are formed on the inner sides of the upper-half casing 220a and lower-half casing 220b, respectively. When the upper-half casing 220a and the lower-half casing 220b are joined together, the recesses 231a and 231b form an antioxidant gas flow passage 230 therein as shown in FIG. 9. Bosses 233a and 233b project from regions around the holes 224a and 224b, respectively. Circular plasma generating electrodes 275a and 275b are embedded in the bosses 233a and 233b, respectively. Each of the end surfaces 234a and 234b of the bosses 233a and 233b has a lower height than a joint surface between the casings 220a and 220b. Thus, when joining the upper-half casing 220a and the lower-half casing 220b together, a gap is created between the end surface 234a of the boss 233a and the end surface 234b of the boss 233b.

Dimples 235a and 235b each having a semicircular section are provided at the ends (base ends) of the upper-half and lower-half casings 220a and 220b opposite to the holes 224a and 224b, respectively. When the upper-half casing 220a and the lower-half casing 220b are joined together, the dimples 235a and 235b each having a semicircular sectional form a cylindrical hole to which the antioxidant gas supply pipe 225 is connected. Projections 232a and 232c are disposed in the recess 231a, and projections 232b and 232d are disposed in the recess 231b. The projections 232a, 232b, 232c and 232d function to change the flow direction of the antioxidant gas flowing from the antioxidant gas supply pipe 225 to promote the heat exchange between the antioxidant gas and the heater 250 mounted on the surface of the casing 220. Each of the projections 232a and 232b is disposed at the center of the corresponding one of the recesses 231a and 231b in the width direction with both ends of each projection creating gaps together with the inner side surfaces of the corresponding one of the recess 231a and 231b. Each of projections 232c and 232d extends from each corresponding side surface of one of the recesses 231a and 231b toward the center of the recess, and is shorter than each recess in the width direction of the recesses 231a and 231b. Each pair of the projections 232c which extend from both opposite inner side surfaces of the recess 231a creates a gap between the tips ends of the projections 232c. Likewise, each pair of the projections 232d which extend from both opposite inner side surfaces of the recess 231b creates a gap between the tips ends of the projections 232d. The projections 232a and 232c are arranged alternately in the direction from the gas supply pipe 225 toward the hole 224a, and the projections 232b and 232d are arranged alternately in the direction from the gas supply pipe 225 toward the hole 224b. Therefore, the antioxidant gas flow passage 230 is formed with the projections 232a, 232b, 232c and 232d and the recesses 231a and 231b, and is configured to change the flow direction of the antioxidant gas multiple times while the antioxidant gas is traveling from the antioxidant gas supply pipe 225 to the hole 224. In other words, the projections 232a, 232b, 232c and 232d configure a labyrinth that changes the flow direction of the antioxidant gas more than once.

A description will be given of a joint configuration of the upper-half casing 220a and the lower-half casing 220b configured above with reference to FIG. 9. When the upper-half casing 220a is overlaid with the lower-half casing 220b with the recesses 231a and 231b facing each other, the surrounding joint surface of the upper-half casing 220a is brought into contact with that of the lower-half casing 220b. In addition, the surfaces of the projections 232a are brought into contact with those of the projections 232b, and the surfaces of the projections 232c are brought into contact with those of the projections 232d. In this way, the antioxidant gas flow passage 230 that is meandering in the antioxidant gas blow-off unit 200 is created. The respective end surfaces 234a and 234b of the bosses 233a and 233b have a lower height than the joint surfaces of the upper-half casing 220a and the lower-half casing 220b, respectively. Thus, when jointing the upper-half casing 220a and the lower-half casing 220b together, the gap is created between the end surface 234a of the boss 233a and the end surface 234b of the boss 233b. The gap serves as an outlet 245 through which the antioxidant gas is blown out to the center of the hole 224 composed of the holes 224a and 224b. When joining the upper-half casing 220a to the lower-half casing 220b, the hole 224a provided in the wall 221a of the upper-half casing 220a is positioned opposite to and concentrically with the hole 224b provided in the wall 221b of the lower-half casing 220b. Further, the bosses 233a and 233b are formed so as to be concentric with the holes 224a and 224b, respectively. The end surface 234a of the boss 233a is positioned opposite to the end surface 234b of the boss 233b. In this case, the plasma generating electrodes 275a and 275b are a pair of electrodes arranged opposite to each other, and the boss 233a is a part of the wall 221a of the upper-half casing 220a, while the boss 233b is a part of the wall 221b of the lower-half casing 220b. Therefore, the plasma generating electrode 275a is embedded in the wall 221a of the upper-half casing 220a, while the plasma generating electrode 275b is embedded in the wall 221b of the lower-half casing 220b.

As shown in FIG. 9, the electrodes 279a and 279b embedded in the walls 221a and 221b of the upper-half and lower-half casings 220a and 220b are partially exposed from the surfaces of the walls 221a and 221b of the upper-half and lower-half casings 220a and 220b, respectively. The electrode 279a is connected to the plasma generating electrode 275a embedded in the boss 233a with a connection wire 276a embedded in the wall 221a. Likewise, the electrode 279b is connected to the plasma generating electrode 275b embedded in the boss 233b with a connection wire 277b embedded in the wall 221b.

Figure 10:
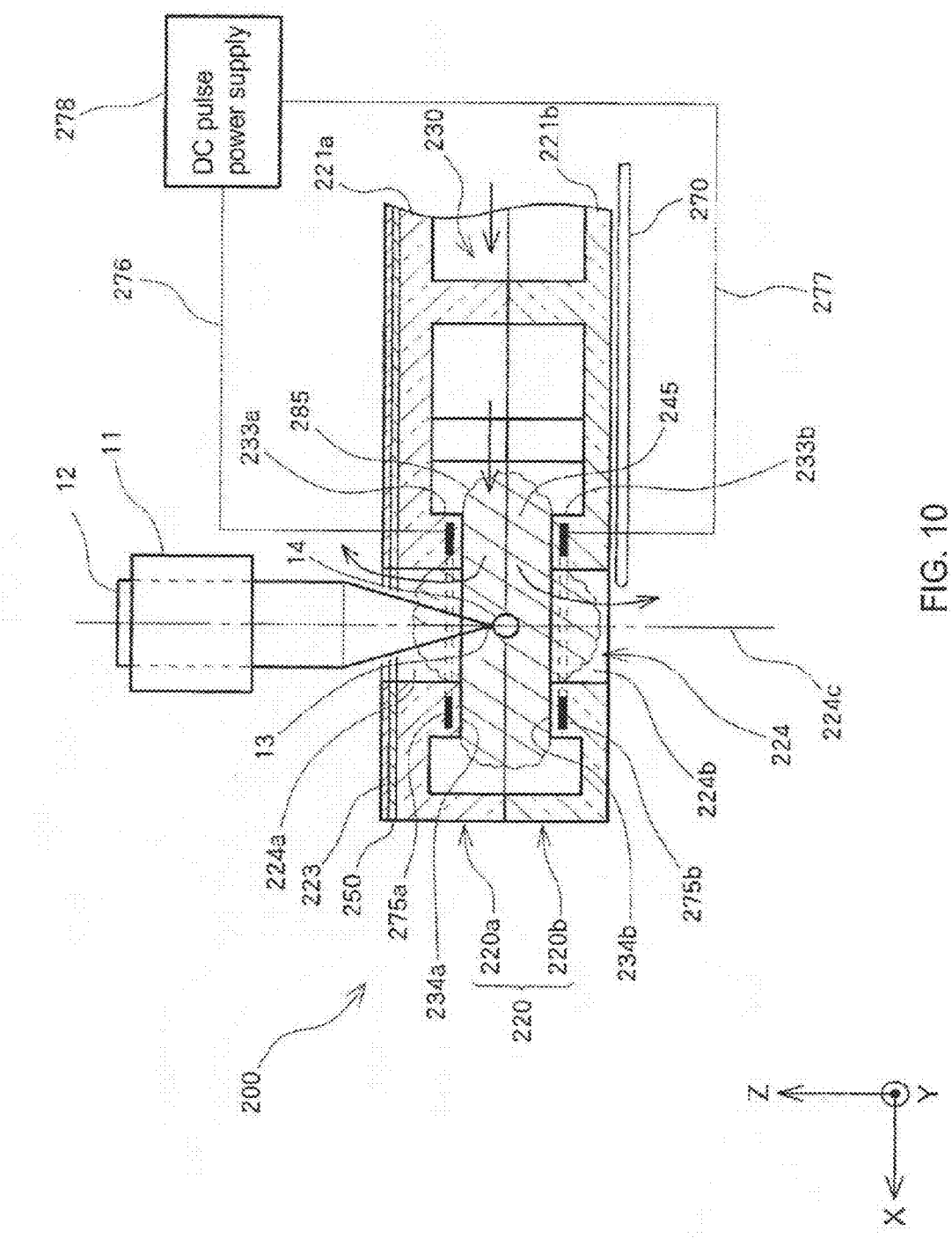
FIG. 10 shows a schematically explanatory view of the cross section of the antioxidant gas blow-off unit in another embodiment of the present invention.

Referring to FIG. 10, an operation of the antioxidant gas blow-off unit 200 configured above will be described below. The antioxidant gas flows into the antioxidant gas flow passage 230 through the antioxidant gas supply pipe 225 shown in FIG. 7, as indicated by arrows in FIG. 10. Examples of the antioxidant gas include an inert gas such as a nitrogen or argon gas and a mixture gas thereof containing a deoxidation gas such as a hydrogen gas. The plasma generating electrodes 275a and 275b are connected to the DC pulse power supply 278 with the connection wires 276 and 277, respectively. First, before the DC pulse power supply 278 energizes the plasma generating electrodes 275a and 275b, the antioxidant gas travels from the antioxidant gas flow passage 230 to a region surrounding the bosses 233a and 233b. Then, the antioxidant gas travels laterally and inwardly from the outer peripheries of the end surfaces 234a and 234b of the bosses 233a and 233b to the holes 224a and 224b on the inner side. After that, the antioxidant gas flows out vertically to the outside through the holes 224a and 224b. Thus, the pressure in the antioxidant gas flow passage 300 is slightly higher than atmospheric pressure, thereby inhibiting air from entering the antioxidant gas flow passage 230 through the holes 224a and 224b. As a result, the antioxidant gas flow passage 230 in the antioxidant gas blow-off unit 200 is filled with the antioxidant gas and the antioxidant gas atmosphere is kept therein.

The heater 250 mounted on the upper surface of the casing 220 increases its temperature by being supplied with power from a power supply (not shown). As shown in FIG. 9, the antioxidant gas flowing into the antioxidant gas flow passage 230 through the antioxidant gas supply pipe 225 is heated to increase its temperature while traveling along the meandering passage formed with the projections 232a to 232d in the direction toward the hole 224. Then, the resultant high-temperature antioxidant gas flows out vertically through the holes 224a and 224b.

When the DC pulse power supply 278 supplies DC pulse power to the plasma generating electrodes 275a and 275b, thereby energizing the electrodes, a plasma is generated from the antioxidant gas in the outlet 245 between the end surface 234a of the boss 233a and the end surface 234b of the boss 233b. Specifically, the plasma is generated from the antioxi- dant gas between the circular plasma generating electrodes 275a and 275b, then travels toward the centers of the holes 224a and 224b along the flow of the antioxidant gas, and vertically flows through the holes 224a and 224b. As a result, an antioxidant gas plasma region 285 is formed within the holes 224a and 224b and inside the outlet 245 between the bosses 233a and 233b, and retains therein the antioxidant gas plasma generated by applying the plasma treatment to the high-temperature antioxidant gas in a high concentration.

As shown in FIG. 10, the center of the capillary 12 is aligned with the center of the holes 224a and 224b, or the center of the hole 224, after which the capillary 12 is moved downward with the ultrasonic horn 11 until the tip of the wire tail 13 extending from the tip of the capillary 12 reaches the center of the antioxidant gas plasma region 285 positioned in the middle of the casing 220. Then, the electric flame off probe 270 disposed below the casing 220 is energized. Electric discharge is thereby generated between the electric flame off probe 270 and the wire tail 13 to form the wire tail 13 into the free air ball 14.

Like the embodiment described with reference to FIGS. 1 to 5, the antioxidant gas blow-off unit 200 in this embodiment can generate a spark at discharge voltage that is much lower than that required to generate electric discharge in a non-plasma antioxidant gas. For this reason, this embodiment suppresses the sputtering phenomenon from emerging on the surface of the electric flame off probe 270, for example, thereby preventing lowering of electric discharge properties due to contaminants on the electric flame off probe 270, which can stably form the good free air balls 14. This embodiment can form the free air balls 14 under the high-temperature and high-concentration antioxidant gas by keeping the temperature of the antioxidant gas plasma region 285 high, thereby suppressing the free air balls 14 from being deformed (formed into a noncircular shape) with the surfaces of the free air balls 14 kept clean.

The antioxidant gas blow-off unit 200 in this embodiment generates plasma while no air enters into the outlet 245 of the casing 220. Therefore, the generated plasma is not oxidized. For this reason, this embodiment can clean the free air balls 14 without oxidizing the surfaces thereof, and can thus perform bonding by using the free air balls 14 having a high temperature with the surfaces thereof maintained clean, thereby improving the bonding qualities.

In the embodiment above, when the DC pulse power supply 278 applies the high pulse voltage to the plasma generating electrodes 275a and 275b to energize the electrodes, the antioxidant gas is subjected to the plasma treatment. Alternatively, the power supply is not limited to the DC pulse power supply 278, and any other power supply can be used as long as the power supply can apply a high pulse voltage to the respective plasma generating electrodes 275a and 275b to produce the plasma from the antioxidant gas. For example, a matching box for matching an incident wave with a reflected wave, or a high-frequency power supply with a matching device can be used to connect a high-frequency electrode of the high-frequency power supply and a ground electrode to the respective plasma generating electrodes 275a and 275b.

Figure 11:
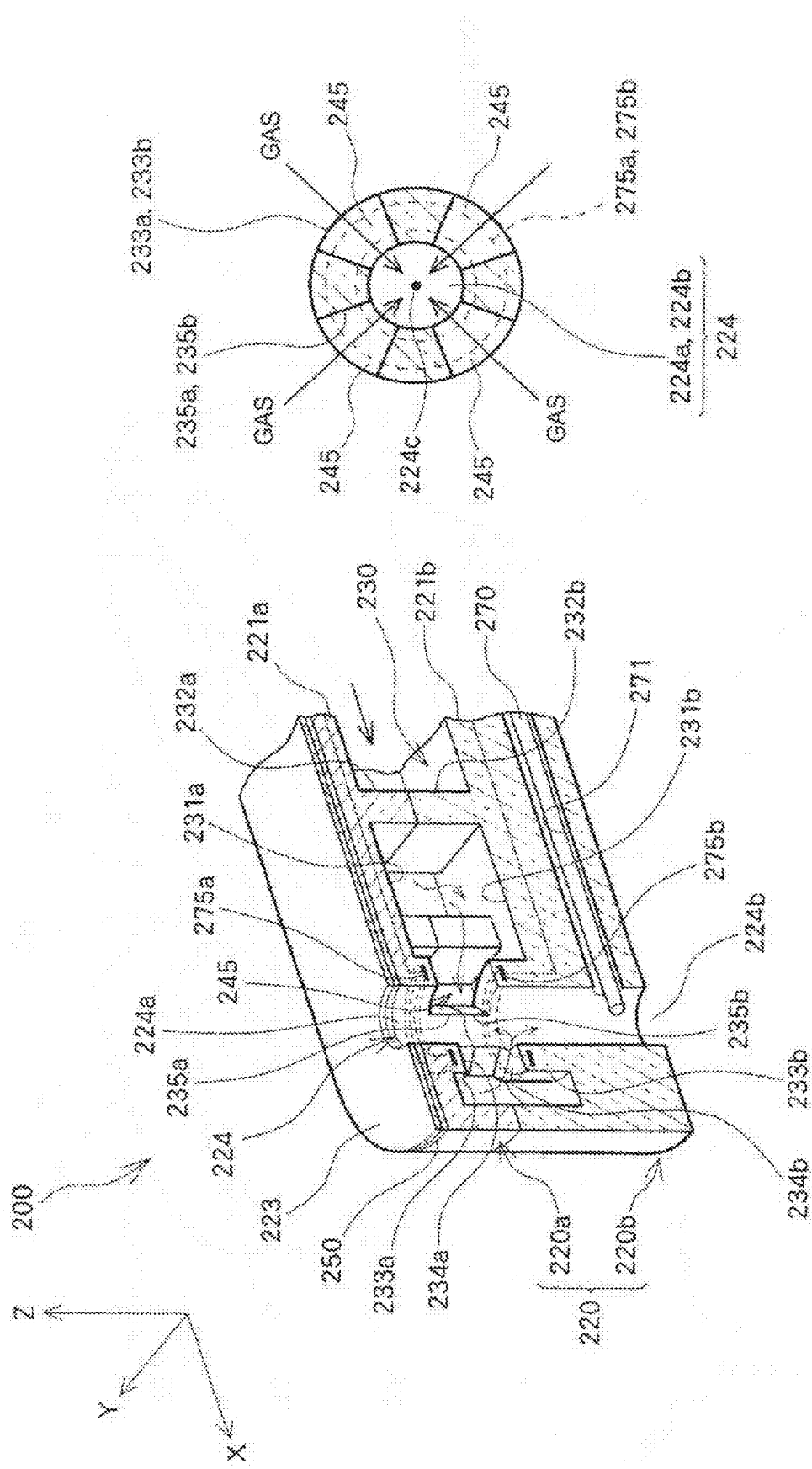
FIG. 11A shows a perspective view of the cross section of the antioxidant gas blow-off unit in another embodiment of the present invention.
FIG. 11B shows a cross-sectional view of the cross section of the antioxidant gas blow-off unit in another embodiment of the present invention.

Next, another embodiment of the present invention will be described with reference to FIG. 11. The same parts in the figure as those in the embodiment described with reference to FIGS. 7 to 10 are denoted by the same reference characters, and thus a description thereof will be omitted. As shown in FIG. 11A, this embodiment has a structure in which the side surface of the hole 224b formed at the lower-half casing 220b in the embodiment described with reference to FIGS. 7 to 10 is provided with a through-hole 271 passing through the wall 221b and a electric flame off probe 270 is disposed in the through-hole 271. Furthermore, four sector projections 235a are provided on the boss 233a of the upper-half casing 220a, and four sector projections 235b are provided on the boss 233b of the lower-half casing 220b. The end surfaces of the projections 235a and 235b make contact with one another as shown in FIG. 11A, forming four outlets 245 for blowing the antioxidant gas toward the center 224c of the hole 224 as shown in FIG. 11B.

In addition to the effects of the embodiment described with reference to FIGS. 7 to 10, this embodiment can exhibit the effect of blowing out the antioxidant gas toward the center of the hole 224 more uniformly than the embodiment described above. Therefore, this embodiment is more effective in improving the bonding quality.

Figure 12:
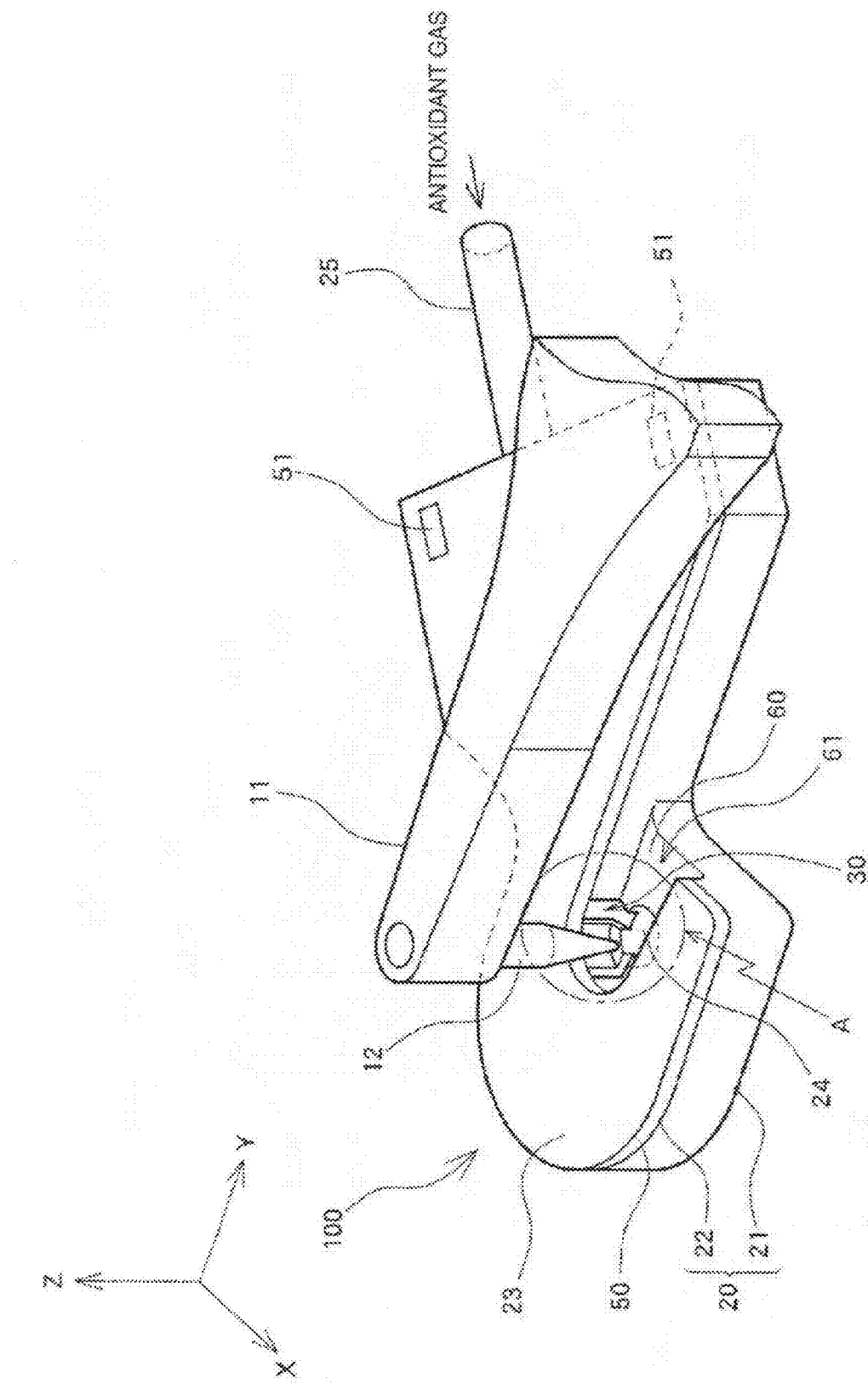
FIG. 12 shows a perspective view of a wire bonding apparatus in which an antioxidant gas blow-off unit according to a still another embodiment of the present invention is installed.
Figure 13:
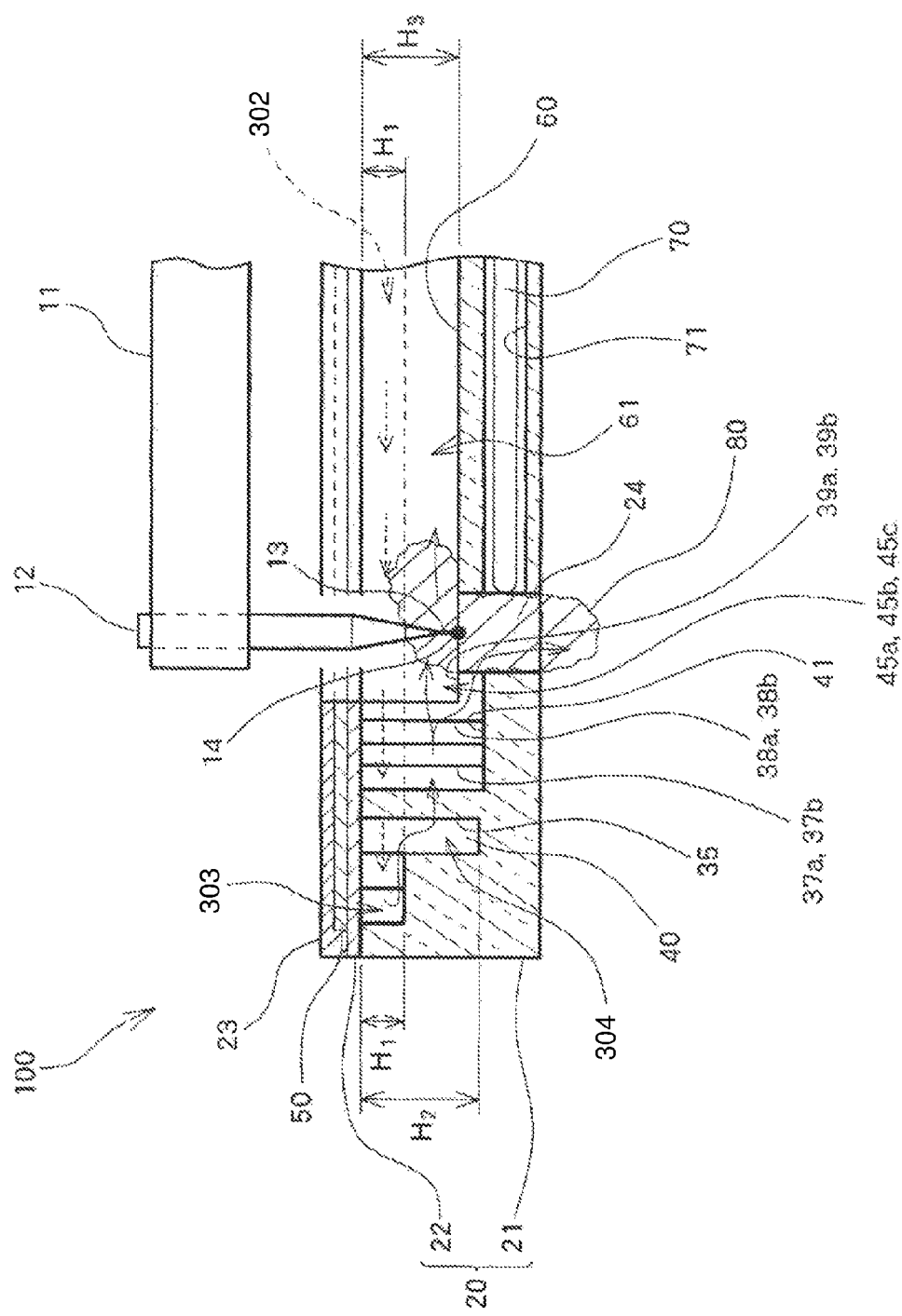
FIG. 13 shows a schematically explanatory view of a cross section of the antioxidant gas blow-off unit in a still another embodiment of the present invention.

A further embodiment of the present invention will be described with reference to FIGS. 12 and 13. The same parts in the figures as those in the embodiment described with reference to FIGS. 1 to 6 are denoted by the same reference characters, and thus a description thereof will be omitted. In this embodiment, as shown in FIG. 13, a heater 50 is slightly smaller in size than the outline of the lid 22 and a cover plate 23, and the cover plate 23 has a periphery thereof provided with a projection that covers the outer end of the heater 50. Therefore, as shown in FIG. 12, the end surface of the heater 50 is not exposed to the outside, so that the heater 50 is not visible from the outside.

Since the end surface of the heater 50 is not exposed to the outside, this embodiment can effectively heat the antioxidant gas in the flow passage. However, when the film-shaped heater 50 is very thin, the configuration without any projection around the cover plate 23 can be employed.

Figure 14:
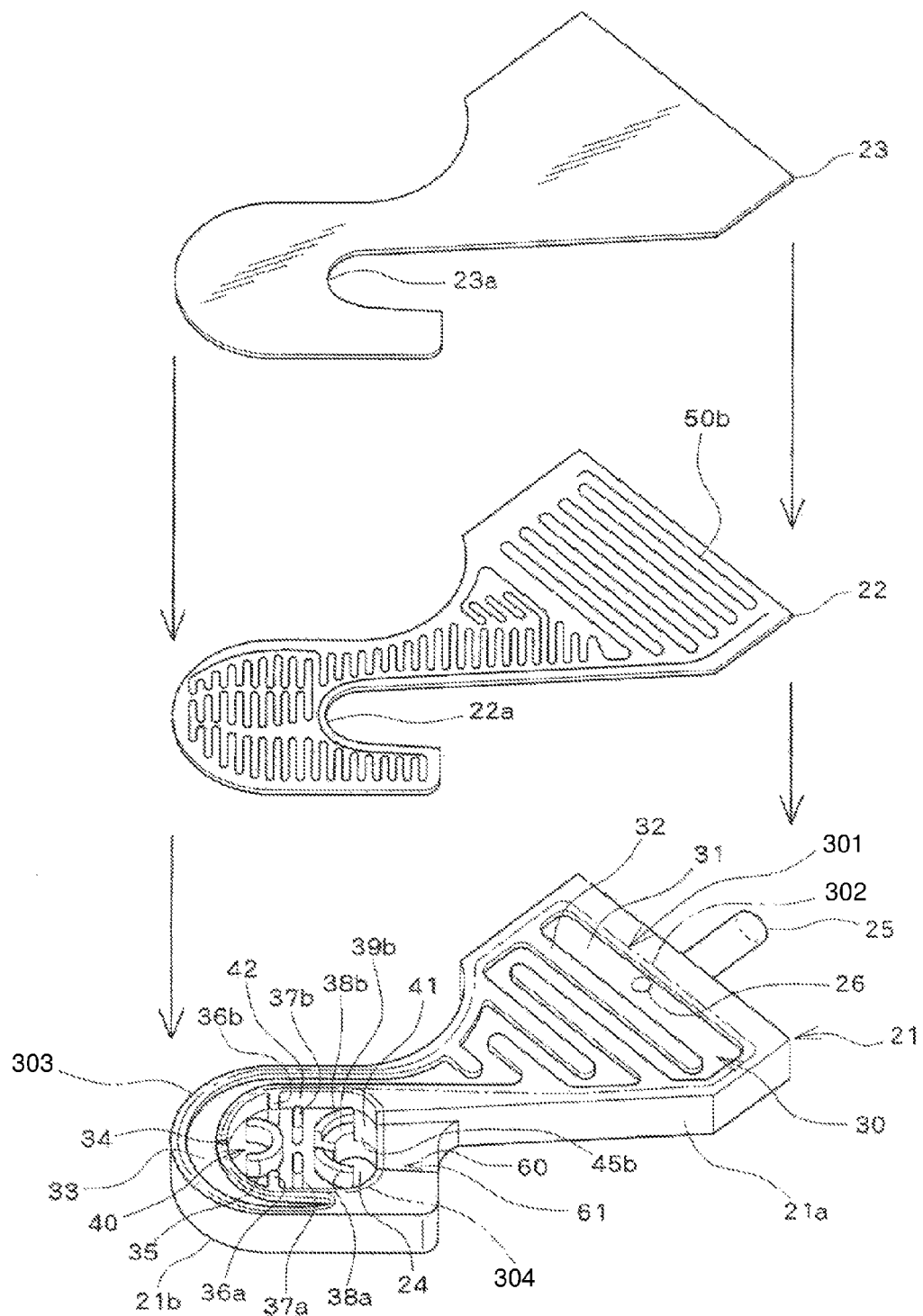
FIG. 14 shows a perspective view of the configuration of the antioxidant gas blow-off unit in a further embodiment of the present invention.

Next, a further embodiment of the present invention will be described with reference to FIG. 14. The same parts in the figure as those in the embodiments described above are denoted by the same reference characters, and thus a description thereof will be omitted. In this embodiment, as shown in FIG. 14, a patterned heating resistor 50b is formed on a surface of a lid 22, instead of using the film-shaped heater 50 in the above-mentioned embodiments above. This embodiment exhibits the same effects as the embodiments described above.

Figure 15:
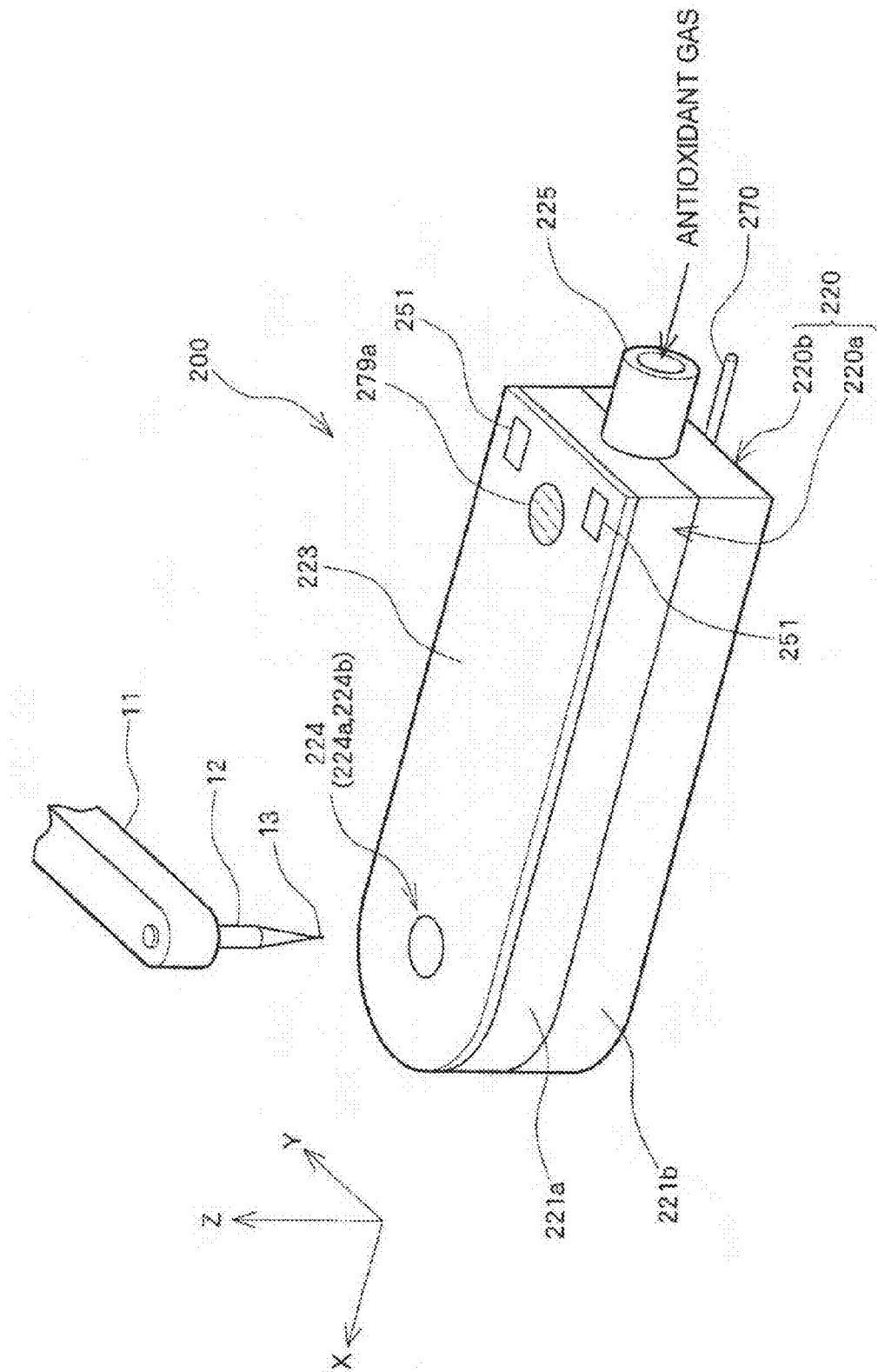
FIG. 15 shows a perspective view of a wire bonding apparatus in which an antioxidant gas blow-off unit according to a still further embodiment of the present invention is installed.
Figure 16:
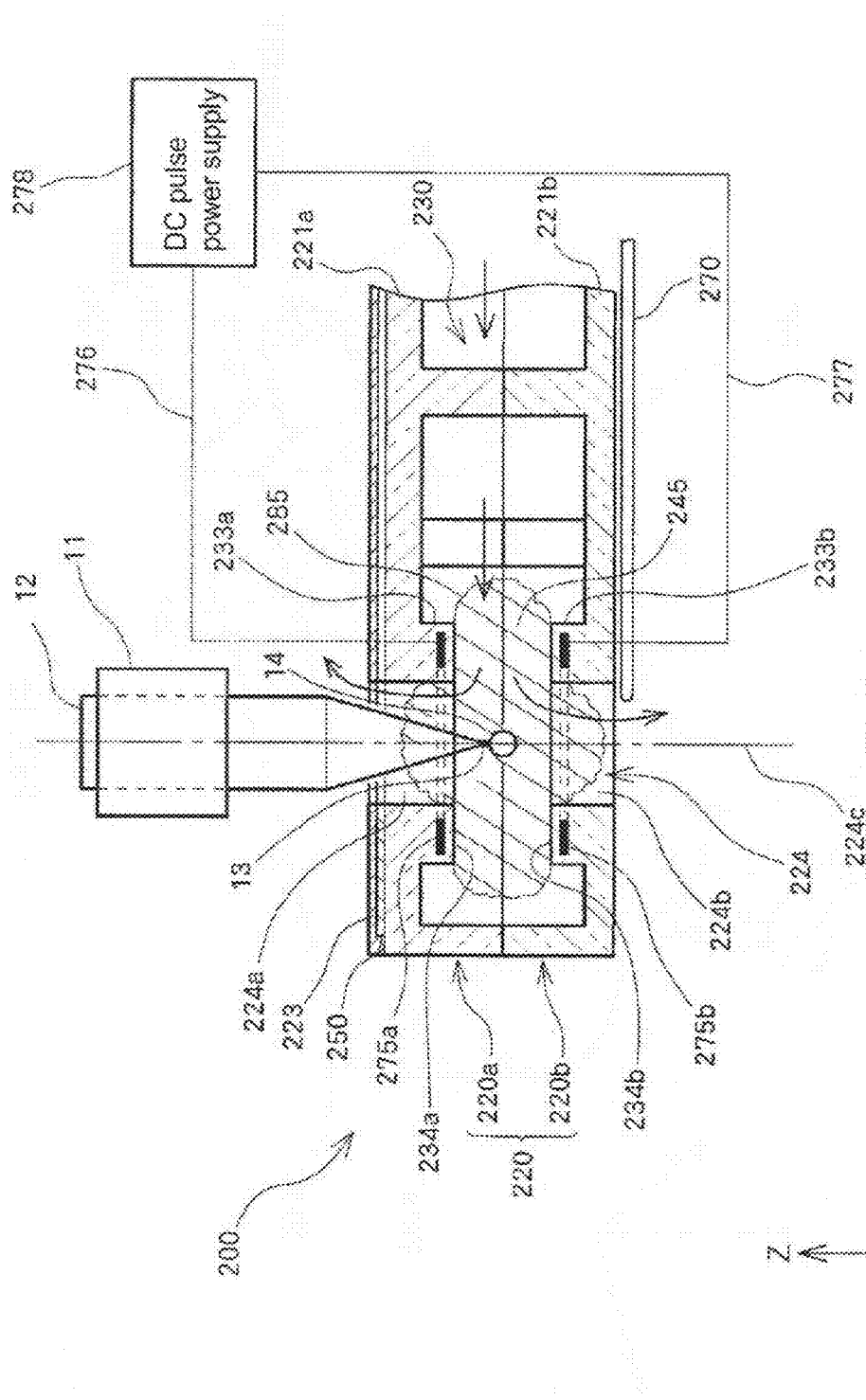
FIG. 16 shows a schematically an explanatory view of a cross section of the antioxidant gas blow-off unit in a still further embodiment of the present invention.

Next, a still further embodiment of the present invention will be described with reference to FIGS. 15 and 16. The same parts in the figures as those in the embodiment described with reference to FIGS. 7 to 10 are denoted by the same reference characters, and thus a description thereof will be omitted. In this embodiment, as shown in FIG. 16, a heater 50 is slightly smaller in size than the outline of the casing 220 and a cover plate 223, and the cover plate 223 has a periphery thereof provided with a projection that covers the outer end of the heater 250, like the embodiment described with reference to FIGS. 12 and 13. Therefore, as shown in FIG. 15, the end surface of the heater 250 is not exposed to the outside, so that the heater 250 is not visible from the outside. Since the end surface of the heater 250 is not exposed to the outside, this embodiment exhibits the effect of effectively heating the antioxidant gas in the passage, in addition to the effects of the embodiment described with reference to FIGS. 7 to 10. When the film-shaped heater 250 is very thin, the configuration without any projection located around the cover plate 223 can be employed.

The present invention is not limited to the embodiments described above, and includes all possible modifications and variations that are within the technical scope or nature of the invention specified by the claims.

REFERENCE SIGNS LIST 11 ultrasonic horn
12 capillary
13 wire tail
14 free air ball
20 base portion
21 main body
21a first part
21b second part
21w, 221a, 221b wall
22 lid
22a, 23a, 50a notch
23, 223 cover plate
24, 224, 224a, 224b hole
24c, 224c center
25, 225 antioxidant gas supply pipe
26 antioxidant gas supply hole
300, 230 antioxidant gas flow passage
301 first flow passage
304 second flow passage
302 upstream flow passage
303 downstream flow passage
31, 33, 60 groove
32 ridges
34 connection flow passage
35, 36a, 36b, 37a, 37b, 38a, 38b, 232a, 232b, 232c, 232d, 235a, 235b projection
39a, 39b stage
40, 231a, 231b recess
41 bottom surface
42 side surface
45a, 45b, 45c, 245 outlet
50, 250 heater
50b heating resistor
51, 251 electrodes
61 groove-shaped flow passage
70, 270 electric flame off probe
71, 271 through-hole
75A, 75B electrode pair
75a, 75b electrode
76, 276, 276a connection wire
77, 277, 277b connection wire
78, 278 DC pulse power supply
85, 285 antioxidant gas plasma region
85a, 85b antioxidant gas plasma
100, 200 antioxidant gas blow-off unit
220 casing
220a upper-half casing
220b lower-half casing
233a, 233b boss
234a, 234b end surface
275a, 275b plasma generating electrode

What is claimed is:

1. An antioxidant gas blow-off unit comprising:
   a base portion configured as a hollow plate having an antioxidant gas flow passage formed therein;
   a hole provided in the base portion to allow a capillary to be inserted thereinto or removed therefrom, the hole communicating with the antioxidant gas flow passage;
   a plurality of electrodes embedded in a wall of the base portion proximal to the hole, the electrodes generating plasma from an antioxidant gas;

wherein the plurality of electrodes comprises at least one pair of electrodes positioned opposite to each other, and wherein the pair of electrodes is embedded in the wall of the base portion that forms the antioxidant gas flow passage;

wherein the antioxidant gas flow passage is provided with at least one outlet through which the antioxidant gas is blown out toward a center of the hole, and wherein the pair of electrodes is embedded in the wall of the base portion within a peripheral region of the outlet.

2. The antioxidant gas blow-off unit according to claim 1, further comprising a heater mounted on an outer surface of the base portion, the heater being configured to heat the antioxidant gas.

3. The antioxidant gas blow-off unit according to claim 2, wherein
the antioxidant gas flow passage comprises:
a first flow passage provided in the vicinity of the outer surface of the base portion on which the heater is mounted; and
a second flow passage provided between the first flow passage and the hole, the second flow passage being deeper than the first flow passage, and
the pair of electrodes are embedded in a wall of the base portion forming the second flow passage.

4. The antioxidant gas blow-off unit according to claim 2, wherein
the antioxidant gas flow passage comprises:
a first flow passage provided in the vicinity of the outer surface of the base portion on which the heater is mounted; and
a second flow passage provided between the first flow passage and the hole, the second flow passage being deeper than the first flow passage, and
the pair of electrodes are embedded in a wall of the base portion that forms the second flow passage.

5. The antioxidant gas blow-off unit according to claim 1, wherein
the antioxidant gas flow passage comprises a labyrinth that changes a flow direction of the antioxidant gas at least twice.

6. An antioxidant gas blow-off unit comprising:
a base portion configured as a hollow plate having an antioxidant gas flow passage formed therein;
a hole provided in the base portion to allow a capillary to be inserted thereinto or removed therefrom, the hole communicating with the antioxidant gas flow passage;
a plurality of electrodes embedded in a wall of the base portion proximal to the hole, the electrodes generating plasma from an antioxidant gas; and
an electric flame off probe disposed in a through-hole provided in a side surface of the hole.

7. The antioxidant gas blow-off unit according to claim 1, further comprising an electric flame off probe disposed on the lower surface side of the base portion.

8. The antioxidant gas blow-off unit according to claim 1, wherein the antioxidant gas flow passage comprises a labyrinth that changes a flow direction of the antioxidant gas at least twice.

9. The antioxidant gas blow-off unit according to claim 2, wherein
the antioxidant gas flow passage comprises:
a first flow passage provided in the vicinity of the outer surface of the base portion on which the heater is mounted; and
a second flow passage provided between the first flow passage and the hole, the second flow passage being deeper than the first flow passage, and
the pair of electrodes are embedded in a wall of the base portion forming the second flow passage.

* * * * *